United States Patent
Kanno et al.

(10) Patent No.: US 9,755,132 B2
(45) Date of Patent: Sep. 5, 2017

(54) THERMOELECTRIC GENERATION UNIT AND THERMOELECTRIC GENERATION SYSTEM

(71) Applicant: Panasonic Corporation, Osaka (JP)

(72) Inventors: Tsutomu Kanno, Kyoto (JP); Akihiro Sakai, Nara (JP); Kohei Takahashi, Osaka (JP); Hiromasa Tamaki, Osaka (JP); Hideo Kusada, Osaka (JP); Yuka Yamada, Nara (JP)

(73) Assignee: Panasonic Corporation, Osaka (JP)

( * ) Notice: Subject to any disclaimer, the term of this patent is extended or adjusted under 35 U.S.C. 154(b) by 228 days.

(21) Appl. No.: 14/845,595

(22) Filed: Sep. 4, 2015

(65) Prior Publication Data

US 2015/0380629 A1    Dec. 31, 2015

Related U.S. Application Data

(63) Continuation of application No. PCT/JP2014/000624, filed on Feb. 6, 2014.

(30) Foreign Application Priority Data

Mar. 12, 2013 (JP) ................................. 2013-048863

(51) Int. Cl.
*H01L 35/30* (2006.01)
*H01L 35/32* (2006.01)
(Continued)

(52) U.S. Cl.
CPC ............. *H01L 35/32* (2013.01); *H01L 35/16* (2013.01); *H01L 35/30* (2013.01); *H01L 35/34* (2013.01)

(58) Field of Classification Search
CPC ..................... H01L 35/00–35/34; H01L 27/16
(Continued)

(56) References Cited

U.S. PATENT DOCUMENTS 6,127,766 A    10/2000 Roidt
2008/0173343 A1    7/2008 Kanno et al.
(Continued)

FOREIGN PATENT DOCUMENTS

JP    2002-111076 A    4/2002
JP    2012-510146 A    4/2012
(Continued)

OTHER PUBLICATIONS

International Search Report for corresponding International Application No. PCT/JP2015/000624 mailed May 13, 2014.
(Continued)

*Primary Examiner* — Bach Dinh
(74) *Attorney, Agent, or Firm* — Renner Otto Boisselle & Sklar

(57) ABSTRACT

A thermoelectric generation unit according to the present disclosure includes a plurality of thermoelectric generation tubes. Each tube has a flow path defined by its inner peripheral surface, and generates an electromotive force in an axial direction based on a temperature difference between its inner peripheral surface and outer peripheral surface. The thermoelectric generation unit includes a container housing the tubes inside, and a plurality of electrically conductive members providing electrical interconnection for the tubes. The container includes a shell surrounding the tubes and a pair of plates being fixed to the shell and having a plurality of openings, with channels being formed so as to house the electrically conductive members and interconnect at least two of the openings. The respective ends of the tubes are inserted in the openings of the plates. The tubes are connected electrically in series by the electrically conductive members housed in the channels.

15 Claims, 23 Drawing Sheets

(51) Int. Cl.
*H01L 35/16* (2006.01)
*H01L 35/34* (2006.01)

(58) Field of Classification Search
USPC .................................................. 136/200–242
See application file for complete search history.

(56) References Cited

U.S. PATENT DOCUMENTS

| | | | |
|---|---|---|---|
| 2011/0258995 A1 | 10/2011 | Limbeck et al. | |
| 2012/0103067 A1* | 5/2012 | Takahashi | G01N 25/32 73/25.05 |
| 2012/0151747 A1* | 6/2012 | Andres | F02G 5/02 29/592.1 |
| 2013/0068273 A1 | 3/2013 | Kanno et al. | |
| 2013/0104953 A1* | 5/2013 | Poliquin | H01L 35/30 136/224 |
| 2014/0086781 A1 | 3/2014 | Sakai et al. | |
| 2014/0102499 A1 | 4/2014 | Takahashi et al. | |

FOREIGN PATENT DOCUMENTS

| | | |
|---|---|---|
| JP | 2013-016685 A | 1/2013 |
| JP | 2013-038219 A | 2/2013 |
| JP | 2013-062275 A | 4/2013 |
| WO | WO 2008/056466 A1 | 5/2008 |
| WO | WO 2012/014366 A1 | 2/2012 |
| WO | WO 2012/170443 A2 | 12/2012 |
| WO | WO 2013/150773 A1 | 10/2013 |
| WO | WO 2013/161174 A1 | 10/2013 |

OTHER PUBLICATIONS

International Preliminary Report on Patentability for corresponding International Application No. PCT/JP2014/000624 dated Mar. 10, 2015.

Co-pending U.S. Appl. No. 14/845,538, filed Sep. 4, 2015 (application provided).

Kanno et al., "A Tubular Electric Power Generator Using Off-Diagonal Thermoelectric Effects", preprints from the 72nd Symposium of the Japan Society of Applied Physics, 30a-F-14, 2011 (with concise English translation).

Sakai et al., "Enhancement in performance of the tubular thermoelectric generation (TTEG)", International Conference on Thermoelectrics, 2012.

Kanno et al., "A Tubular Thermoelectric Generator with Piled Conical Rings Structure", Advanced Technology Research Laboratories, Panasonic Corporation, Kyoto, Japan Aug. 29, 2011.

Kanno et al., "Development of thermoelectric generation tube for utilising unutilized thermo energy", Panasonic Corporation, Japan, Jul. 24, 2012, pp. 100-108 (with concise English translation).

* cited by examiner (a)

(b)

THERMOELECTRIC GENERATION UNIT AND THERMOELECTRIC GENERATION SYSTEM

This is a continuation of International Application No. PCT/JP2014/000624, with an international filing date of Feb. 6, 2014, which claims priority of Japanese Patent Application No. 2013-048863, filed on Mar. 12, 2013, the contents of which are hereby incorporated by reference.

BACKGROUND

1. Technical Field

The present application relates to a thermoelectric generation unit including a thermoelectric conversion element which converts heat into electric power. The present disclosure also relates to a thermoelectric generation system including a plurality of thermoelectric generation units.

2. Description of the Related Art

A thermoelectric conversion element is an element which can convert heat into electric power, or electric power into heat. A thermoelectric conversion element made of a thermoelectric material that exhibits the Seebeck effect is able to obtain thermal energy from a heat source at a relatively low temperature (e.g., 200 degrees Celsius or less), and convert it into electric power. With a thermoelectric generation technique based on such a thermoelectric conversion element, it is possible to collect and effectively utilize thermal energy which would conventionally have been dumped unused into the ambient in the form of steam, hot water, exhaust gas, or the like.

Hereinafter, a thermoelectric conversion element which is made of a thermoelectric material may be referred to as a "thermoelectric generator". A generic thermoelectric generator has a so-called "π structure" in which a p-type semiconductor and an n-type semiconductor of mutually different carrier electrical polarities are combined (for example, Japanese Laid-Open Patent Publication No. 2013-016685). In a "π structure" thermoelectric generator, a p-type semiconductor and an n-type semiconductor are connected electrically in series, and thermally in parallel. In a "π structure", the direction of temperature gradient and the direction of electric current flow are parallel or antiparallel to each other. This makes it necessary to provide output terminals at the electrodes on the high-temperature heat source side or the low-temperature heat source side. Therefore, complicated wiring structure will be required for a plurality of thermoelectric generators each having a "π structure" to be connected in electrical series.

International Publication No. 2008/056466 (hereinafter "Patent Document 1") discloses a thermoelectric generator which includes a stacked body sandwiched between a first electrode and a second electrode opposing each other, the stacked body including bismuth layers and metal layers of a different metal from bismuth being alternately stacked. In the thermoelectric generator disclosed in Patent Document 1, the planes of stacking are inclined with respect to the direction of a line connecting the first electrode and the second electrode. Moreover, tube-type thermoelectric generators are disclosed in International Publication No. 2012/014366 (hereinafter "Patent Document 2") and Kanno et al., preprints from the 72$^{nd}$ Symposium of the Japan Society of Applied Physics, 30a-F-14 "A Tubular Electric Power Generator Using Off-Diagonal Thermoelectric Effects" (2011) and A. Sakai et al., International conference on thermoelectrics 2012 "Enhancement in performance of the tubular thermoelectric generator (TTEG)" (2012).

SUMMARY

A thermoelectric generation unit as one implementation of the present disclosure comprises a plurality of thermoelectric generation tubes, wherein each of the plurality of thermoelectric generation tubes has an outer peripheral surface and an inner peripheral surface, and a flow path defined by the inner peripheral surface, and generates an electromotive force in an axial direction of the thermoelectric generation tube based on a temperature difference between the inner peripheral surface and the outer peripheral surface; and the thermoelectric generation unit further includes a container housing the plurality of thermoelectric generation tubes inside, the container having a fluid inlet port and a fluid outlet port for allowing a fluid to flow inside the container and a plurality of openings into which the respective thermoelectric generation tubes are inserted, and a plurality of electrically conductive members providing electrical interconnection for the plurality of thermoelectric generation tubes, the container including: a shell surrounding the plurality of thermoelectric generation tubes; and a pair of plates each being fixed to the shell and having the plurality of openings, with channels being formed so as to house the plurality of electrically conductive members and interconnect at least two of the plurality of openings, wherein respective ends of the thermoelectric generation tubes are inserted in the plurality of openings of the plates, the plurality of electrically conductive members being housed in the channels in the plates, and the plurality of thermoelectric generation tubes are connected in electrical series by the plurality of electrically conductive members housed in the channels.

According to the above aspect, it is possible to improve thermoelectric generation practicality.

These general and specific aspects may be implemented using a unit, a system, and a method, and any combination of units, systems, and methods.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1A:
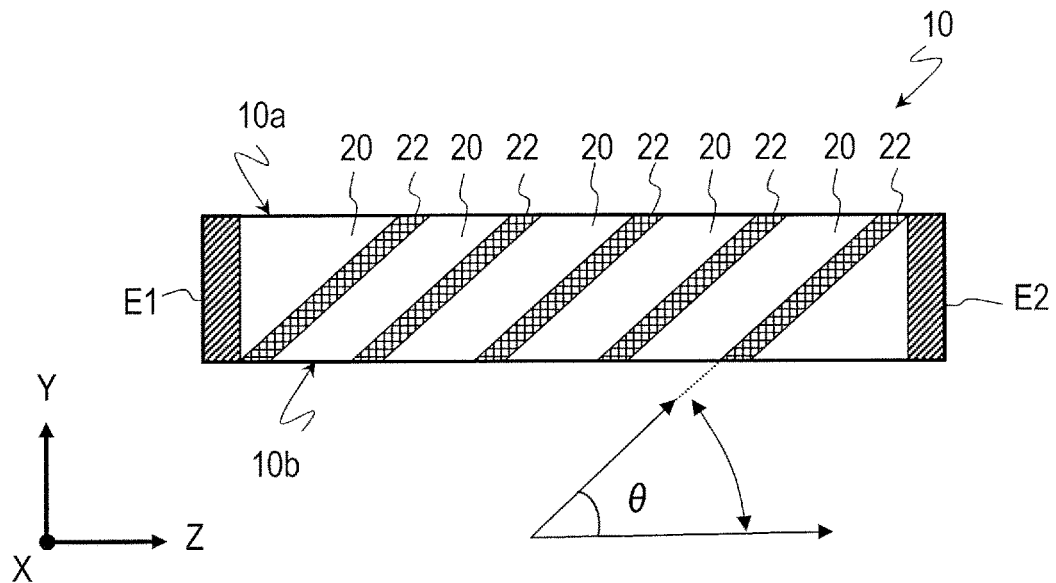
FIG. 1A is a schematic cross-sectional view of a thermoelectric generator 10.

There is a desire for a practical thermoelectric generation unit and system utilizing a thermoelectric generation technique.

A non-limiting and exemplary embodiment of the thermoelectric generation unit according to the present disclosure includes a plurality of thermoelectric generation tubes, each thermoelectric generation tube having an outer peripheral surface and an inner peripheral surface and a flow path defined by the inner peripheral surface. Each thermoelectric generation tube is arranged to generate an electromotive force in an axial direction of the thermoelectric generation tube based on a temperature difference between the inner peripheral surface and the outer peripheral surface.

The thermoelectric generation unit further includes a container housing the plurality of thermoelectric generation tubes inside, and a plurality of electrically conductive members providing electrical interconnection for the plurality of thermoelectric generation tubes. The container has a fluid inlet port and a fluid outlet port for allowing a fluid to flow inside the container and a plurality of openings into which the respective thermoelectric generation tubes are inserted. More specifically, the container includes a shell surrounding the plurality of thermoelectric generation tubes, and a pair of plates each being fixed to the shell and having a plurality of openings into which the respective thermoelectric generation tubes are inserted, with channels being formed so as to house the plurality of electrically conductive members and interconnect at least two of the plurality of openings.

Respective ends of the thermoelectric generation tubes are inserted into the plurality of openings of the plates. Moreover, the plurality of electrically conductive members providing electrical interconnection for the thermoelectric generation tubes are housed in the channels in the plates, such that the plurality of thermoelectric generation tubes are connected in electrically in series by the electrically conductive members.

In one embodiment, the plurality of electrically conductive members include at least one connection plate having two throughholes in which two said thermoelectric generation tubes are respectively inserted, and two terminal plates each having one throughhole in which one said thermoelectric generation tube is inserted and having an end protruding to the exterior. Each of the plurality of electrically conductive members is electrically connected to the thermoelectric generation tube or tubes inserted in the throughhole or throughholes.

In one embodiment, the channels include at least one interconnection connecting two or more of the plurality of openings together, and two terminal connections respectively extending from two of the plurality of openings to an outer edge of the plate or plates. The at least one connection plate is housed in the at least one interconnection, and the two terminal plates are respectively housed in the two terminal connections, each terminal plate partially protruding to the exterior of the plate.

In one embodiment, between the two terminal plates, the plurality of thermoelectric generation tubes are connected electrically in series via the at least one connection plate, and power generated in the plurality of thermoelectric generation tubes is retrieved to the exterior at the two terminal plates.

In one embodiment, the plurality of electrically conductive members each include a body made of a metal and an insulating coating at least partially covering a surface of the body.

A thermoelectric generation system according to one aspect of the present disclosure comprises any of the aforementioned thermoelectric generation unit, a first medium path communicating with the fluid inlet port and the fluid outlet port of the container, a second medium path encompassing the flow paths of the plurality of thermoelectric generation tubes, and an electric circuit electrically connected to the plurality of electrically conductive members to retrieve power generated in the plurality of thermoelectric generation tubes.

In one embodiment, the thermoelectric generation system further comprises an accumulator connected to the electric circuit. The thermoelectric generation system may include a DC-AC inverter connected to the electric circuit.

A thermoelectric generation system according to another aspect of the present disclosure comprises a plurality of thermoelectric generation units including a first thermoelectric generation unit and a second thermoelectric generation unit, the first and second thermoelectric generation units each being any of the aforementioned thermoelectric generation unit. The thermoelectric generation system may have a plurality of first openings communicating with the flow paths of the plurality of thermoelectric generation tubes in the first thermoelectric generation unit, and a plurality of second openings communicating with the flow paths of the plurality of thermoelectric generation tubes in the second thermoelectric generation unit.

In one embodiment, a first medium path communicating with the fluid inlet port and fluid outlet port of the container in the first thermoelectric generation unit and the fluid inlet port and fluid outlet port of the container in the second thermoelectric generation unit, and a second medium path encompassing the flow paths of the plurality of thermoelectric generation tubes in the first and second thermoelectric generation units.

In one embodiment, the second medium path is arranged to allow a fluid to flow in a same direction in the flow paths of the plurality of thermoelectric generation tubes.

The thermoelectric generation unit according to the present disclosure provides an improved thermoelectric generation practicality.

<Basic Construction and Operation Principles of Thermoelectric Generator>

Prior to illustrating embodiments of the thermoelectric generation unit according to the present disclosure, The basic construction and operation principles of this thermoelectric generator to be used for the thermoelectric generation unit will be described. As will be described later, a tubular thermoelectric generator is used in the thermoelectric generation unit according to the present disclosure. However, the operation principles of the tubular thermoelectric generator can be explained with respect to a thermoelectric generator of a simpler shape, and in fact be better understood when so explained.

Figure 1B:
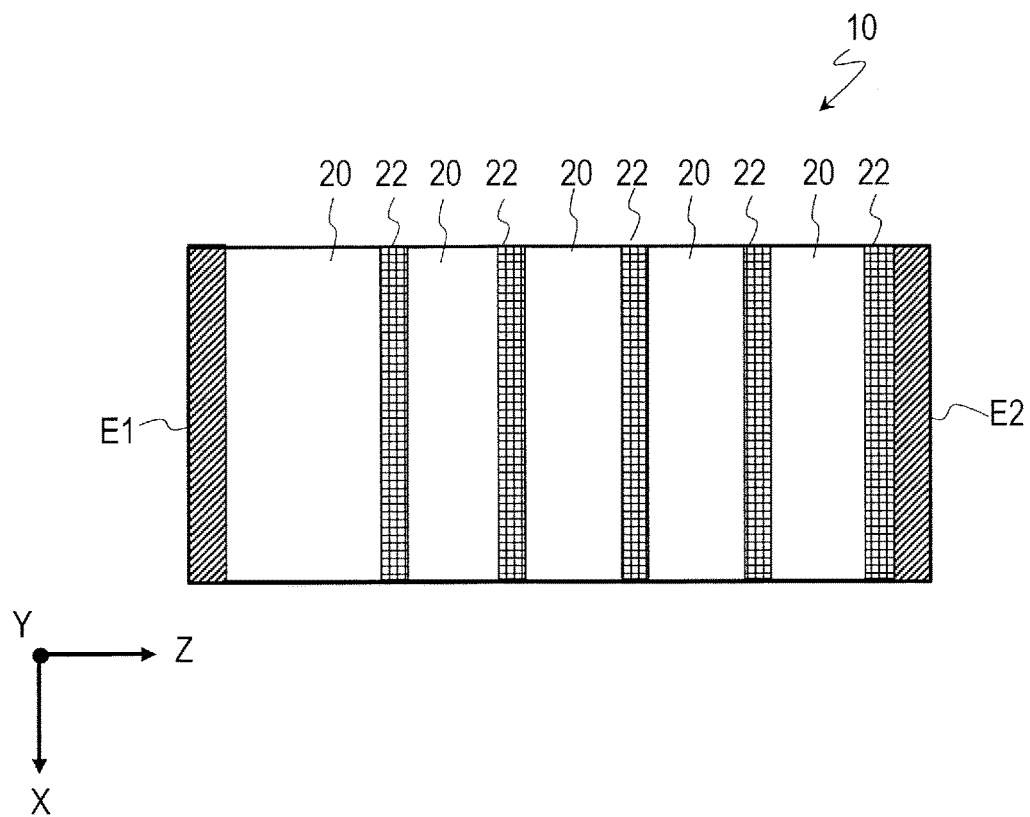
FIG. 1B is an upper plan view of the thermoelectric generator 10 in FIG. 1A.

First, FIG. 1A and FIG. 1B will be referred to. FIG. 1A is a schematic cross-sectional view of a thermoelectric generator 10 having a generally rectangular solid shape, and FIG. 1B is an upper plan view of the thermoelectric generator 10. For reference sake, FIG. 1A and FIG. 1B show the X axis, the Y axis, and the Z axis, which are orthogonal to one another. The thermoelectric generator 10 shown in the figure is structured so that metal layers 20 and thermoelectric material layers 22 are alternately stacked (i.e., a stacked body) while being inclined. Although the shape of stacked body in this example is a rectangular solid, the same operation principles will also apply to other shapes.

In the thermoelectric generator 10 shown in the figure, a first electrode E1 and a second electrode E2 are provided in a manner of sandwiching the aforementioned stacked body on the left and on the right. In the cross section shown in FIG. 1A, the planes of stacking are inclined by an angle θ (0<θ<π radian) with respect to the Z-axis direction.

In the thermoelectric generator 10 having such a construction, when a temperature difference is introduced between the upper face 10a and the lower face 10b, heat propagates primarily through the metal layers 20 whose thermal conductivity is higher than that of the thermoelectric material layers 22, and thus a Z axis component occurs in the temperature gradient of each thermoelectric material layer 22. Therefore, an electromotive force along the Z-axis direction occurs in each thermoelectric material layer 22 due to the Seebeck effect, these electromotive forces being superposed in series within the stacked body. Consequently, as a whole, a large potential difference occurs between the first electrode E1 and the second electrode E2. A thermoelectric generator having the stacked body shown in FIG. 1A and FIG. 1B is disclosed in Patent Document 1. The entire disclosure of Patent Document 1 is incorporated herein by reference.

Figure 2:
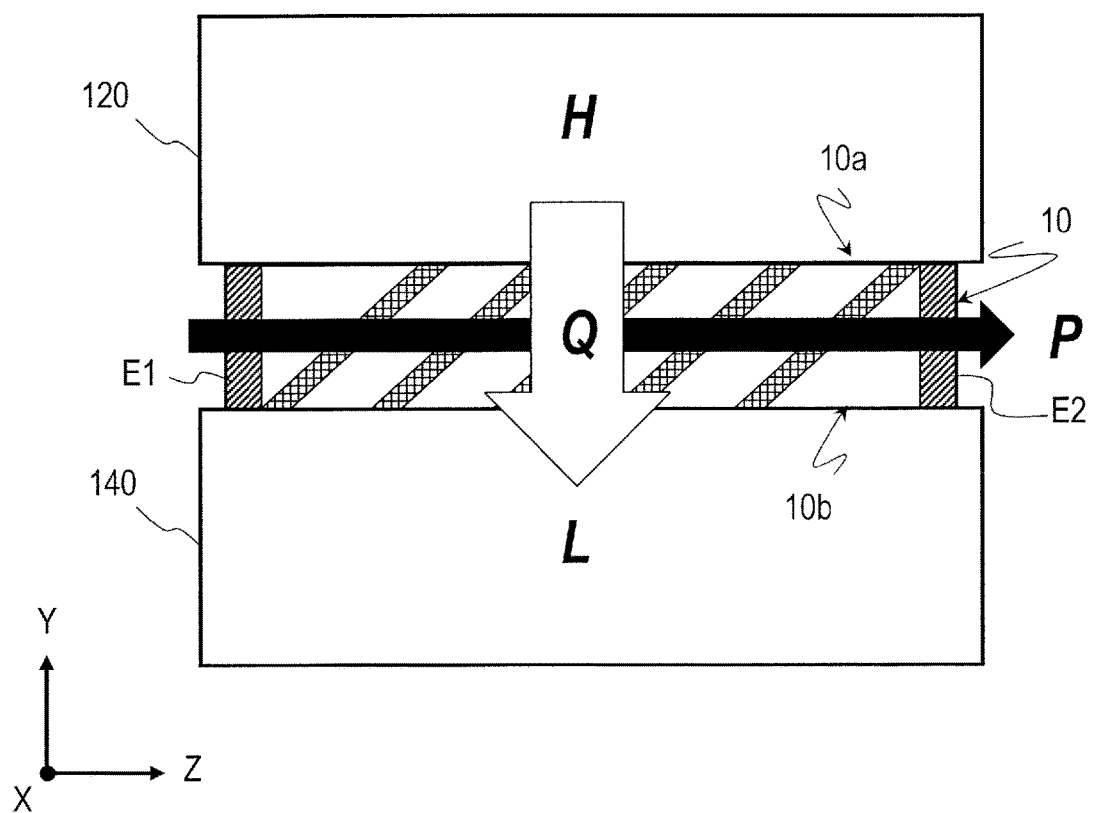
FIG. 2 is a diagram showing a state where a high-temperature heat source 120 is in contact with an upper face 10a of the thermoelectric generator 10, and a low-temperature heat source 140 is in contact with a lower face 10b.

FIG. 2 shows a state where a high-temperature heat source 120 is in contact with the upper face 10a of the thermoelectric generator 10 and a low-temperature heat source 140 is in contact with the lower face 10b. In this state, heat Q flows from the high-temperature heat source 120 to the low-temperature heat source 140 via the thermoelectric generator 10, so that electric power P can be retrieved from the thermoelectric generator 10 via the first electrode E1 and the second electrode E2. From a macroscopic point of view, in the thermoelectric generator 10, the direction of temperature gradient (the Y-axis direction) and the direction of the electric current (the Z-axis direction) are orthogonal, so that there is no need to introduce a temperature difference between the pair of electrodes E1 and E2 for taking out electric power. Note that the example shown in FIG. 2 schematically illustrates electric power P flowing from the left to the right in the figure. However, this is only an example. For example, when the kind of thermoelectric material is changed, the flow direction of electric power P may become opposite of that shown in FIG. 2.

For simplicity, a case where the shape of the stacked body of the thermoelectric generator 10 is a rectangular solid has been described above; the following embodiments will be directed to exemplary thermoelectric generators in which the stacked body has a tubular shape. Such a tubular thermoelectric generator will sometimes be referred to as a "thermoelectric generation tube" in the present specification. In the present specification, the term "tube" is interchangeably used with the term "pipe", and is to be interpreted to encompass both a "tube" and a "pipe".

<Outline of Thermoelectric Generation Unit>

Hereinafter, the thermoelectric generation unit according to the present disclosure will be described in outline.

Figure 3A:
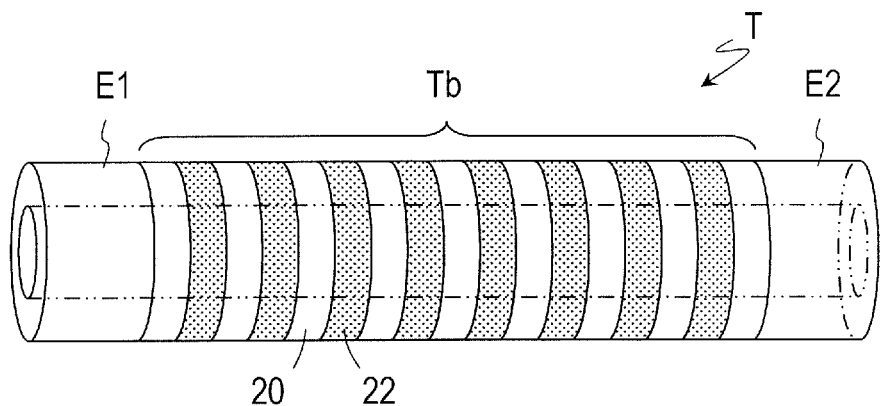
FIG. 3A is a perspective view showing the schematic construction of a thermoelectric generation tube T which may be used in an illustrative thermoelectric generation unit according to the present disclosure.
Figure 3B:
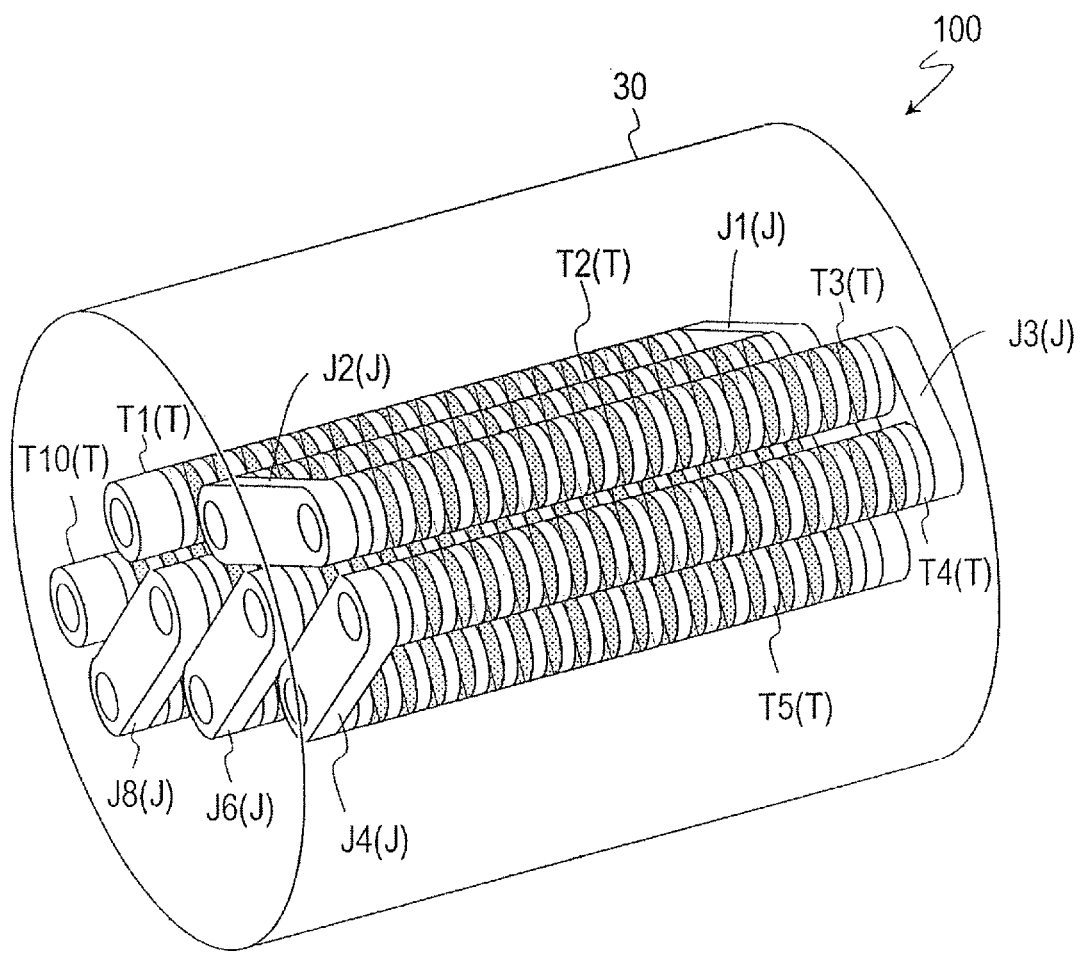
FIG. 3B is a perspective view showing a schematic construction of an illustrative thermoelectric generation unit 100 according to the present disclosure.

First, FIGS. 3A and 3B are referred to. FIG. 3A is a perspective view showing an exemplary thermoelectric generation tube T. The thermoelectric generation tube T includes: a tube body Tb in which metal layers 20 and thermoelectric material layers 22, each having a throughhole in the center, are alternately stacked while being inclined; and a pair of electrodes E1 and E2. A method for producing such a thermoelectric generation tube T is disclosed in Patent Document 2, for example. According to the method disclosed in Patent Document 2, metal cups having a hole in the bottom and thermoelectric material cups similarly having a hole in the bottom are alternately stacked together, and subjected to plasma sintering in that state, whereby both are fastened together. The entire disclosure of Patent Document 2 is incorporated herein by reference.

The thermoelectric generation tube T of FIG. 3A is connected to conduits so that a hot medium, for example, flows in the flow path (which hereinafter may be referred to as the "internal flow path") which is defined by the inner peripheral surface in its interior. In that case, the outer peripheral surface of the thermoelectric generation tube T is placed in contact with a cold medium. Thus, by introducing a temperature difference between the inner peripheral surface and the outer peripheral surface of the thermoelectric generation tube T, a potential difference occurs between the pair of electrodes E1 and E2, thereby enabling electric power to be retrieved.

When any reference is made to "high temperature" or "hot", or a "low temperature" or "cold", is made in the present specification, as in "hot medium" and "cold medium", these terms indicate relatively highness or lowness of temperature between them, rather than any specific temperatures of these media. A "medium" is typically a gas, a liquid, or a fluid composed of a mixture thereof. A "medium" may contain solid, e.g., powder, which is dispersed within a fluid.

The shape of the thermoelectric generation tube T may be anything tubular, without being limited to cylindrical. In other words, when the thermoelectric generation tube T is cut along a plane which is perpendicular to the axis of the thermoelectric generation tube T, the resultant shapes created by sections of the "outer peripheral surface" and the "inner peripheral surface" do not need to be circles, but may be any closed curves, e.g., ellipses or polygons. Although the axis of the thermoelectric generation tube T is typically linear, it is not limited to being linear. These would be clear from the principles of thermoelectric generation which have been described with reference to FIG. 1A, FIG. 1B, and FIG. 2.

FIG. 3B is a perspective view showing a schematic construction of an illustrative thermoelectric generation unit 100 according to the present disclosure. The thermoelectric generation unit 100 shown in FIG. 3B includes a plurality of thermoelectric generation tubes T, a container 30 which internally houses these thermoelectric generation tubes T, and a plurality of electrically conductive members J which electrically connect the thermoelectric generation tubes T. In the example of FIG. 3B, ten thermoelectric generation tubes T1 to T10 are accommodated in the container 30. Typically, the ten thermoelectric generation tubes T1 to T10 are disposed substantially in parallel to one another, but such disposition is not the only implementation.

The thermoelectric generation tubes T1 to T10 each have an outer peripheral surface and an inner peripheral surface, and an internal flow path which is defined by the inner peripheral surface, as has been mentioned earlier. The thermoelectric generation tubes T1 to T10 are each constructed so as to generate an electromotive force in the respective axial direction because of a temperature difference between the inner peripheral surface and the outer peripheral surface. In other words, by introducing a temperature difference between the outer peripheral surface and the inner peripheral surface in each of the thermoelectric generation tubes T1 to T10, electric power is retrieved from the thermoelectric generation tubes T1 to T10. For example, by placing a hot medium in contact with the internal flow path of each of the thermoelectric generation tubes T1 to T10 and a cold medium in contact with the outer peripheral surface of each of the thermoelectric generation tubes T1 to T10, electric power can be retrieved from the thermoelectric generation tubes T1 to T10. Conversely, a cold medium may be placed in contact with the inner peripheral surface of each of the thermoelectric generation tubes T1 to T10 and a hot medium may be placed in contact with their outer peripheral surface.

In the example shown in FIG. 3B, the medium which comes in contact with the outer peripheral surface of the thermoelectric generation tubes T1 to T10 inside the container 30 and the medium which comes in contact with the inner peripheral surface of each thermoelectric generation tube T1 to T10 in the internal flow path of the respective thermoelectric generation tube are supplied through separate conduits (not shown), thus being isolated so as not to intermix.

Figure 4:
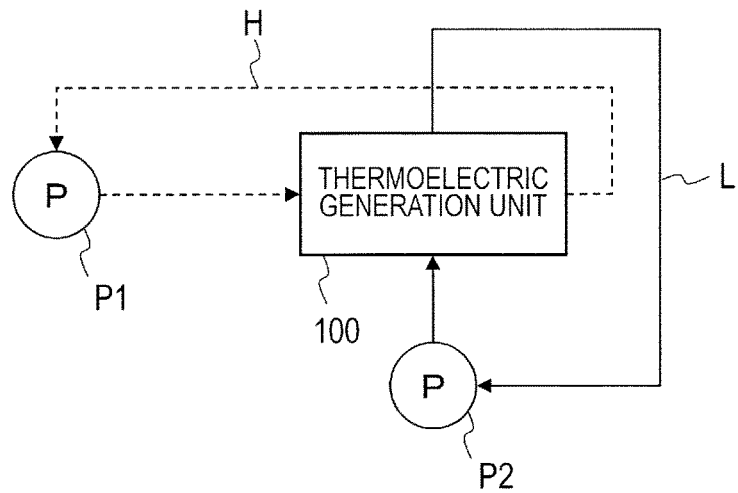
FIG. 4 is a block diagram showing an exemplary construction for introducing a temperature difference between the outer peripheral surface and the inner peripheral surface of the thermoelectric generation tube T.

FIG. 4 is a block diagram showing an exemplary construction for introducing a temperature difference between the outer peripheral surface and the inner peripheral surface of the thermoelectric generation tube T. In FIG. 4, arrows H in broken lines schematically represent a flow of the hot medium, and arrows L in solid lines schematically represent a flow of the cold medium. In the example shown in FIG. 4, the hot medium and the cold medium are circulated by pumps P1 and P2, respectively. For example, the hot medium is supplied in the internal flow path of each thermoelectric generation tube T1 to T10, while the cold medium is supplied inside the container 30. Although omitted from illustration in FIG. 4, heat to the hot medium is supplied from a high-temperature heat source (e.g., a heat exchanger), and heat from the cold medium is supplied to a low-temperature heat source. As the high-temperature heat source, steam, hot water, exhaust gas, or the like of relatively low temperature (e.g., 200 degrees Celsius or less), which has conventionally been dumped unused into the ambient, can be used. It will be appreciated that a heat source of higher temperature may be used.

In the example shown in FIG. 4, the hot medium and the cold medium are illustrated as being circulated by the pumps P1 and P2, respectively; however, the thermoelectric generation unit of the present disclosure is not limited to such an example. Both or one of the hot medium and the cold medium may be dumped into the ambient from the respective heat source(s), without constituting a circulating system. For example, high-temperature hot spring water that has sprung from the ground may be supplied to thermoelectric generation unit 100 as the hot medium, and thereafter utilized for purposes other than power generation in the form of hot spring water which has cooled down, or dumped as it is. As the cold medium, too, phreatic water, river water, or sea water may be drawn up to be supplied to the thermoelectric generation unit 100. After such is used as the cold medium, it may be lowered to an appreciated temperature as necessary, and returned to the original water source, or dumped into the ambient.

FIG. 3B is referred to again. In the thermoelectric generation unit 100 of the present disclosure, a plurality of thermoelectric generation tubes T are electrically connected via the electrically conductive members J. In the example of FIG. 3B, each adjacent pair consisting of two thermoelectric generation tubes T is interconnected by a respective electrically conductive member J. As a whole, the plurality of thermoelectric generation tubes T are connected in electrical series. For example, the two thermoelectric generation tubes T3 and T4 appearing foremost in FIG. 3B are interconnected by the electrically conductive member J3 at their right end. At their left end, these two thermoelectric generation tubes T3 and T4 are connected to other thermoelectric generation tubes T2 and T5, respectively, by the electrically conductive members J2 and J4.

Figure 5:
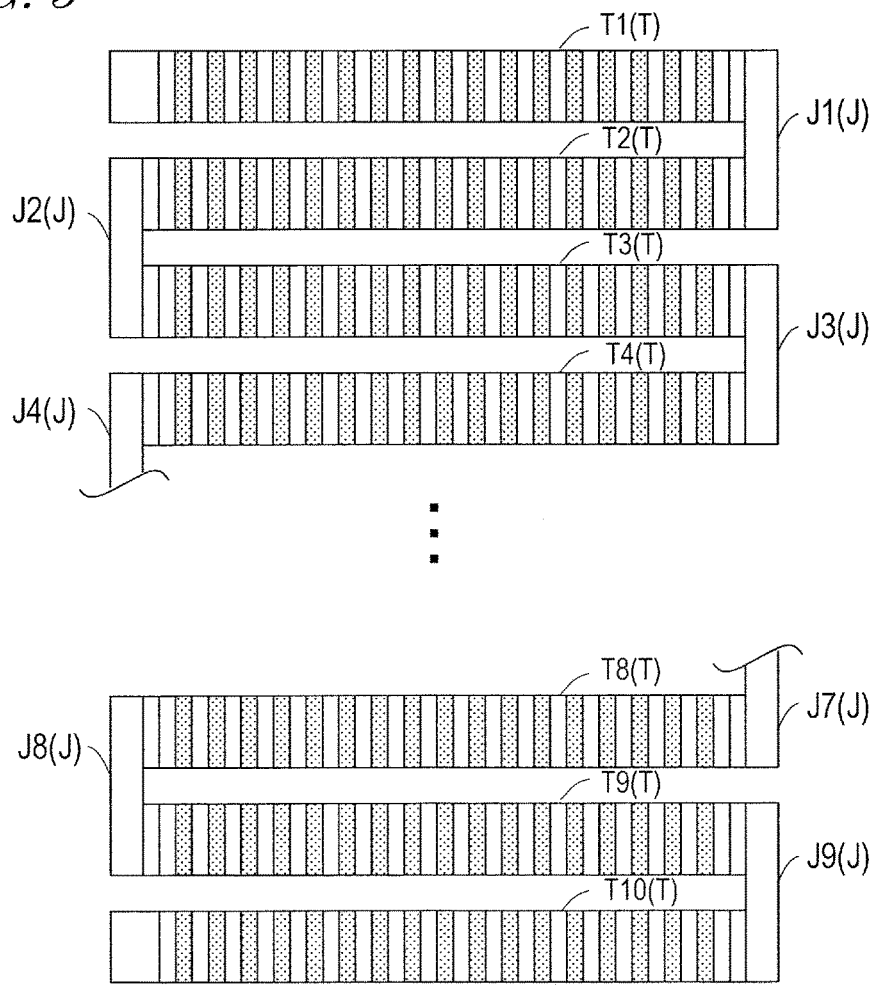
FIG. 5 is a diagram schematically showing an example of electrical connection of thermoelectric generation tubes T1 to T10.

FIG. 5 schematically shows an example of electrical connection of the thermoelectric generation tubes T1 to T10. As shown in FIG. 5, each of the electrically conductive members J1 to J9 electrically connects two thermoelectric generation tubes. The electrically conductive members J1 to J9 are arrayed so as to connect the thermoelectric generation tubes T1 to T10 in electrical series as a whole. In this example, the circuit that is constituted by the thermoelectric generation tubes T1 to T10 and the electrically conductive members J1 to J9 is traversable. This circuit may partially include thermoelectric generation tubes which are connected in parallel, and it is not essential that the circuit be traversable.

In the example of FIG. 5, an electric current flows from the thermoelectric generation tube T1 to the thermoelectric generation tube T10, for example. The electric current may flow from the thermoelectric generation tube T10 to the thermoelectric generation tube T1. The direction of this electric current is determined by the type of thermoelectric material used for the thermoelectric generation tubes T, the direction of heat flow occurring at the inner peripheral surface and the outer peripheral surface of the thermoelectric generation tube T, the direction of inclination of the planes of stacking in the thermoelectric generation tubes T, and so on. The connection of the thermoelectric generation tubes T1 to T10 is determined so that electromotive forces occurring in the respective thermoelectric generation tubes T1 to T10 do not cancel one another, but are superposed.

Note that the direction of the electric current flowing through the thermoelectric generation tubes T1 to T10 and the flow direction of the medium (hot medium or the cold medium) flowing through the internal flow paths of the thermoelectric generation tubes T1 to T10 are unrelated. For example, in the example of FIG. 5, the flow direction of the medium flowing through the internal flow paths of the thermoelectric generation tubes T1 to T10 may universally be from the left to the right in the figure, for example.

<Detailed Construction of Thermoelectric Generation Tube T>

Figure 6A:
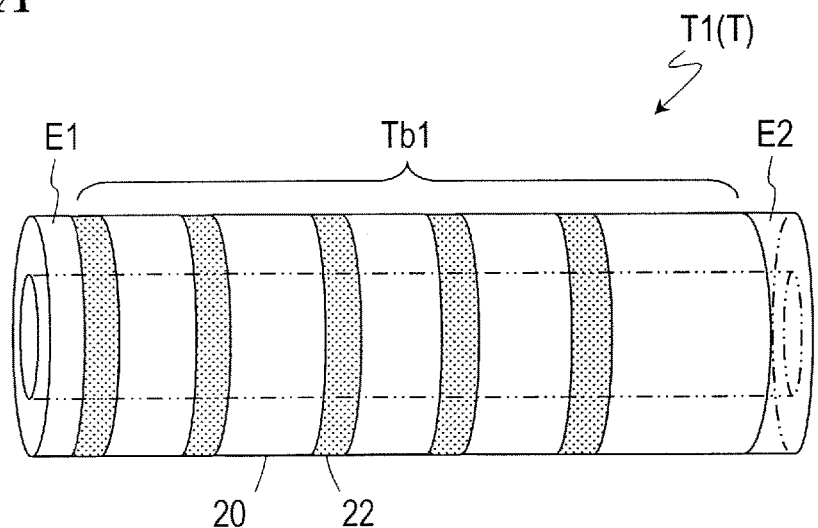
FIG. 6A is a perspective view showing one of thermoelectric generation tubes T included in the thermoelectric generation unit 100 (which herein is the thermoelectric generation tube T1).

Next, with reference to FIGS. 6A and 6B, the detailed construction of the thermoelectric generation tube T will be described. FIG. 6A is a perspective view showing one of the thermoelectric generation tubes T included in the thermoelectric generation system 100 (which herein is the thermoelectric generation tube T1). The thermoelectric generation tube T1 includes a tube body Tb1, and a first electrode E1 and a second electrode E2 provided at the respective ends of the tube body Tb1. The tube body Tb1 is constructed so that metal layers 20 and thermoelectric material layers 22 are alternately stacked. In the present specification, the direction of a line connecting the first electrode E1 and the second electrode E2 may be referred to as the "stacking direction". This "stacking direction" coincides with the axial direction of the thermoelectric generation tube.

Figure 6B:
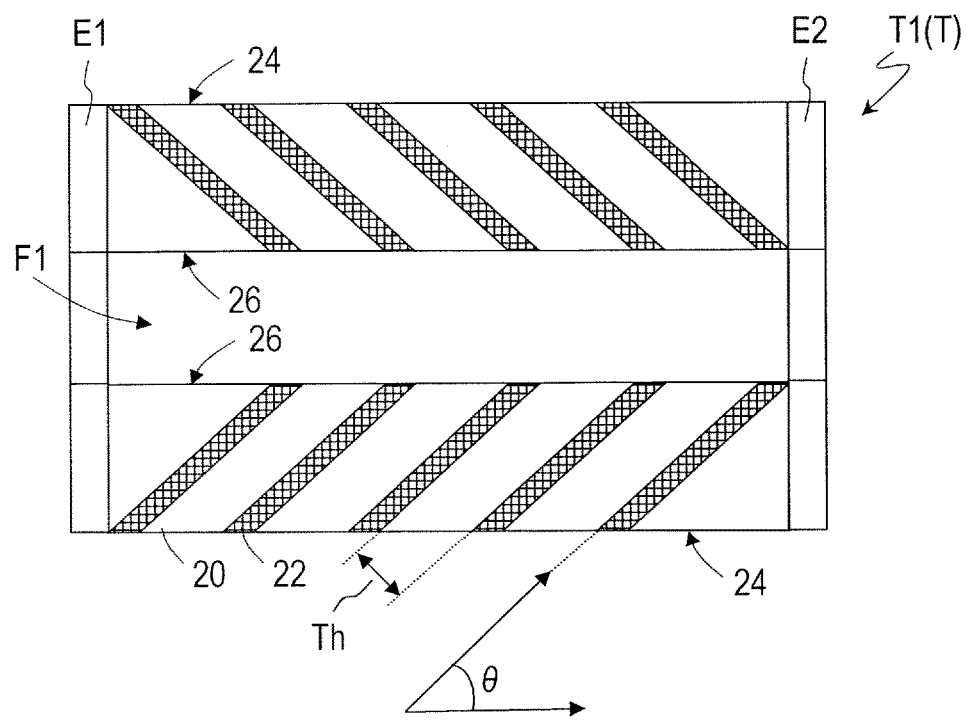
FIG. 6B is a diagram showing a schematic cross section of the thermoelectric generation tube T1 as viewed on a plane containing an axis (center axis) of the thermoelectric generation tube T1.

FIG. 6B shows a schematic cross section of the thermoelectric generation tube T1 as viewed on a plane containing an axis (center axis) of the thermoelectric generation tube T1. As shown in FIG. 6B, the thermoelectric generation tube T1 has an outer peripheral surface 24 and an inner peripheral surface 26. A region which is defined by the inner peripheral surface 26 forms a flow path F1. In the illustrated example, cross sections of the outer peripheral surface 24 and the inner peripheral surface 26 taken perpendicular to the axial direction each present the shape of a circle. However, these shapes are not limited to circles, but may be ellipses or polygons, as mentioned earlier. There is no particular limitation to the cross-sectional area of the flow path as viewed on a plane which is perpendicular to the axial direction. The cross-sectional area of the flow path may be appropriately set in accordance with the flow rate of the medium which is supplied to the internal flow path of the thermoelectric generation tube T. Similarly, the number of thermoelectric generation tubes may be appropriately set in accordance with the flow rate of the medium which is supplied to the internal flow paths of the thermoelectric generation tubes.

In the illustrated example, the first electrode E1 and the second electrode E2 both have cylindrical shapes. However, the shapes of the first electrode E1 and the second electrode E2 are not limited thereto. At or near the respective end of the tube body Tb1, the first electrode E1 and the second electrode E2 may each have any arbitrary shape which is electrically connectable to at least one of a metal layer 20 or a thermoelectric material layer 22 and which does not obstruct the flow path F1. In the example shown in FIGS. 6A and 6B, the first electrode E1 and the second electrode E2 have outer peripheral surfaces conforming to the outer peripheral surface 24 of the tube body Tb1; however, it is not necessary for the outer peripheral surfaces of the first electrode E1 and the second electrode E2 to conform to the outer peripheral surface 24 of the tube body Tb1. For example, the first electrode E1 and the second electrode E2 may have outer peripheral surfaces with a diameter (outer diameter) which is greater or smaller than the diameter (outer diameter) of the outer peripheral surface 24 of the tube body Tb1. Moreover, the cross-sectional shapes of the first electrode E1 and the second electrode E2 taken along a plane which is perpendicular to the axial direction may differ from the cross-sectional shape of the outer peripheral surface 24 of the tube body Tb1 taken along a plane which is perpendicular to the axial direction.

The first electrode E1 and the second electrode E2 are made of an electrically conductive material, typically a metal. The first electrode E1 or the second electrode E2, or both, may be composed of one or more metal layers 20 located at or near the respective end of the tube body Tb1. In that case, it can be said that the tube body Tb1 partially functions as the first electrode E1 or the second electrode E2. Alternatively, the first electrode E1 and the second electrode E2 may be made of metal layers or annular metal members which partially cover the outer peripheral surface 24 of the tube body Tb1, or a pair of cylindrical metal members fitted partially into the flow path F1 from both ends of the tube body Tb1 so as to be in contact with the inner peripheral surface 26 of the tube body Tb1.

As shown in FIG. 6B, the metal layers 20 and the thermoelectric material layers 22 are alternately stacked while being inclined. A thermoelectric generation tube with such a construction basically operates under similar principles to the principles which have been described with reference to FIGS. 1A, 1B, and FIG. 2. Therefore, when a temperature difference is introduced between the outer peripheral surface 24 and the inner peripheral surface 26 of the thermoelectric generation tube T1, a potential difference occurs between the first electrode E1 and the second electrode E2. The general direction of the temperature gradient at this time is the radial direction of the thermoelectric generation tube T1 (i.e., a direction perpendicular to the stacking direction).

The angle of inclination θ of the planes of stacking in the tube body Tb1 (hereinafter simply referred to as the "inclination angle") may be set within a range of not less than 5° and not more than 60°, for example. The inclination angle θ may be not less than 20° and not more than 45°. The appropriate range for the inclination angle θ differs depending on the combination of the material composing the metal layers 20 and the thermoelectric material composing the thermoelectric material layers 22.

The ratio between the thickness of each metal layer 20 and the thickness of each thermoelectric material layer 22 (hereinafter simply referred to as the "stacking ratio") in the tube body Tb1 may be set within the range of 20:1 to 1:9, for example. Herein, the thickness of each metal layer 20 means a thickness along a direction which is perpendicular to the planes of stacking (i.e., the thickness indicated by arrow-heads Th in FIG. 6B). Similarly, the thickness of each thermoelectric material layer 22 means a thickness along a direction which is perpendicular to the planes of stacking. Note that the total numbers of metal layers 20 and thermoelectric material layers 22 being stacked can be appropriately set.

The metal layers 20 may be made of any arbitrary metal material, e.g., nickel or cobalt. Nickel and cobalt are examples of metal materials exhibiting high thermoelectric generation characteristics. The metal layers 20 may contain silver or gold. The metal layers 20 may contain any of such exemplary metal materials alone, or an alloy of them. In the case where the metal layers 20 are made of an alloy, this alloy may contain copper, chromium, or aluminum. Examples of such alloys are constantan, CHROMEL™, or ALUNEL™.

The thermoelectric material layers 22 may be made of any arbitrary thermoelectric material depending on the temperature of use. Examples of thermoelectric materials that may be used for the thermoelectric material layers 22 includes: thermoelectric materials of a single element, such as bismuth or antimony; alloy-type thermoelectric materials, such as BiTe-type, PbTe-type, and SiGe-type; and oxide-type thermoelectric materials, such as $Ca_xCoO_2$, $Na_xCoO_2$, and $SrTiO_3$. The "thermoelectric material" in the present specification means a material having a Seebeck coefficient with an absolute value of 30 μV/K or more and an electrical resistivity of 10 mΩcm or less. Such a thermoelectric material may be crystalline or amorphous. In the case where the temperature of the hot medium is about 200 degrees Celsius or less, the thermoelectric material layers 22 may be made of a dense body of bismuth antimony telluride, for example. The representative chemical composition of bismuth antimony telluride is $Bi_{0.5}Sb_{1.5}Te_3$, but this is not a limitation. A dopant such as selenium may be contained in bismuth antimony telluride. The mole fractions of bismuth and antimony may be adjusted as appropriate.

Other examples of thermoelectric materials composing the thermoelectric material layers 22 are bismuth telluride, lead telluride, and so on. When the thermoelectric material layers 22 are made of bismuth telluride, it may be of the chemical composition $Bi_2Te_X$, where $2<X<4$. A representative chemical composition is $Bi_2Te_3$. Antimony or selenium may be contained in $Bi_2Te_3$. A bismuth telluride chemical composition containing antimony can be expressed as $(Bi_{1-Y}Sb_Y)_2Te_X$, where $0<Y<1$, and more preferably $0.6<Y<0.9$.

The materials composing the first electrode E1 and the second electrode E2 may be any material that has good electrical conductivity. The first electrode E1 and the second electrode E2 may be made of metals such as copper, silver, molybdenum, tungsten, aluminum, titanium, chromium, gold, platinum, and indium. Alternatively, they may be made of nitrides or oxides, such as titanium nitride (TiN), indium tin oxide (ITO), and tin dioxide ($SnO_2$). The first electrode E1 or second electrode E2 may be made of solder, silver solder, an electrically conductive paste, or the like. In the case where both ends of the tube body Tb1 are metal layers 20, the metal layers 20 may serve as the first electrode E1 and the second electrode E2, as mentioned above.

As a typical example of the thermoelectric generation tube, the present specification illustrates an element in which metal layers and thermoelectric generation material layers are alternately stacked; however, the structure of the thermoelectric generation tube to be used in the present disclosure is not limited to such an example. The above-described thermoelectric generation is possible by stacking first layers that are made of a first material which has a relatively low Seebeck coefficient and a relatively high thermal conductivity, and second layers that are made of a second material which has a relatively high Seebeck coefficient and a relatively low thermal conductivity. The metal layers 20 and the thermoelectric material layers 22 are, respectively, examples of first layers and second layers.

<Embodiment of Thermoelectric Generation Unit>

Figure 7A:
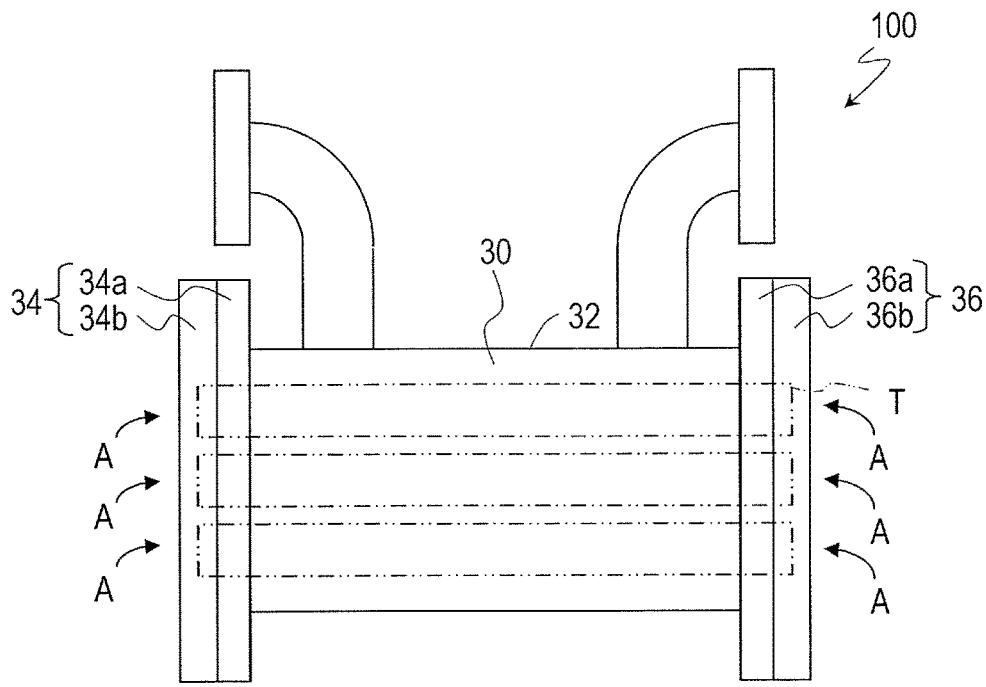
FIG. 7A is a front view showing one implementation of a thermoelectric generation unit according to the present disclosure.
Figure 7B:
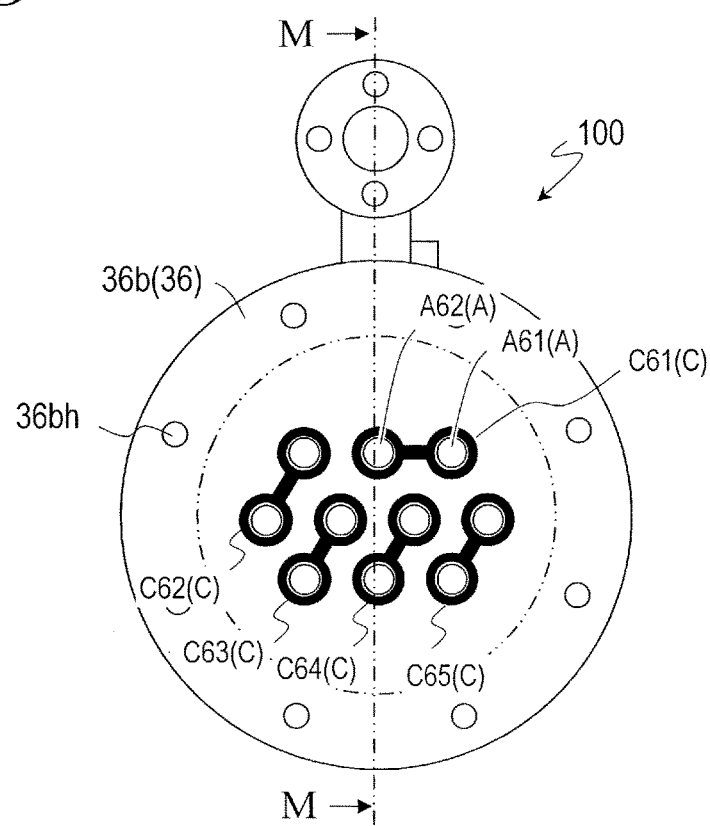
FIG. 7B is a diagram showing one of the side faces of the thermoelectric generation unit 100 (shown herein is a right side view).

Next, FIGS. 7A and 7B are referred to. FIG. 7A is a front view showing one implementation of the thermoelectric generation unit according to the present disclosure, and FIG. 7B is a diagram showing one of the side faces of the thermoelectric generation unit 100 (shown herein is a right side view). As shown in FIG. 7A, this implementation of the thermoelectric generation unit 100 includes a plurality of thermoelectric generation tubes T and a container 30 housing the plurality of thermoelectric generation tubes T inside. Such a structure may appear to resemble the "shell and tube structure" of a heat exchanger. In a heat exchanger, however, the plurality of tubes merely function as pipelines for a fluid to flow through, which do not require electrical connection. In a thermoelectric generation system according to the present disclosure, stable electrical connection needs to be achieved between tubes for practicality, unlike in a heat exchanger.

As has been described with reference to FIG. 4, the hot medium and the cold medium are supplied to the thermoelectric generation unit 100. For example, through a plurality of openings A, a hot medium is supplied in the internal flow path of each of the thermoelectric generation tubes T1 to T10. On the other hand, a cold medium is supplied inside the container 30 via a fluid inlet port 38*a* described later. As a result, a temperature difference is introduced between the outer peripheral surface and the inner peripheral surface of each thermoelectric generation tube T. At this time, in the thermoelectric generation unit 100, heat exchange occurs between the hot medium and the cold medium, and an electromotive force occurs in each of the thermoelectric generation tubes T1 to T10 in the respective axial direction.

The container 30 in the present embodiment includes a cylindrical shell 32 surrounding the thermoelectric generation tubes T, and a pair of plates 34 and 36 provided so as to close both open ends of the shell 32. More specifically, the plate 34 is fixed on the left end of the shell 32, whereas the plate 36 is fixed on the right end of the shell 32. The plates 34 and 36 each have a plurality of openings A through which the thermoelectric generation tubes T are respectively inserted, such that both ends of each thermoelectric generation tube T are inserted into the corresponding pair of openings A in the plates 34 and 36.

Similarly to the tube sheets of a shell and tube heat exchanger, the plates 34 and 36 have the function of supporting a plurality of tubes (i.e., the thermoelectric generation tubes T) so that these tubes are spatially separated from each other. However, as will be described in detail later, the plates 34 and 36 of the present embodiment have an electrical connection capability that the tube sheets of a heat exchanger do not have.

In the example shown in FIG. 7A, the plate 34 includes a first plate portion 34*a* which is fixed on the shell 32, and a second plate portion 34*b* which is detachably mounted to the first plate portion 34*a*. Similarly, the plate 36 includes a first plate portion 36*a* which is fixed on the shell 32, and a second plate portion 36*b* which is detachably mounted to the first plate portion 36*a*. The openings A in the plates 34 and 36 penetrate through, respectively, the first plate portions 34*a* and 36*a* and the second plate portions 34*b* and 36*b*, thus leaving the flow paths of the thermoelectric generation tubes T open to the exterior of the container 30.

Examples of materials to compose the container 30 include metals such as stainless steels, HASTELLOY™ or INCONEL™. Examples of other materials to compose the container 30 include vinyl chloride resin and acrylic resin. The shell 32 and the plates 34, 36 may be made of the same material, or made of different materials. If the shell 32 and the first plate portions 34*a* and 36*a* are made of a metal(s), the first plate portions 34*a* and 36*a* may be welded onto the shell 32. If flanges are provided at both ends of the shell 32, the first plate portions 34*a* and 36*a* may be fixed onto such flanges.

During operation, a fluid (i.e., the cold medium or the hot medium) is introduced into the container 30. Therefore, the inside of the container 30 should be kept either airtight or watertight. As will be described later, each opening A of the plates 34, 36 is sealed in an airtight or watertight manner once the ends of a thermoelectric generation tube T are inserted through the opening A. This realizes a structure in which no gap is left between the shell 32 and the plates 34, 36 and which is kept airtight or watertight throughout the operation.

As shown in FIG. 7B, ten openings A are provided in the plate 36. Similarly, ten openings A are provided in the plate 34. In the example shown in FIGS. 7A and 7B, the openings A in the plate 34 and the openings A in the plate 36 are placed in mirror symmetric relationship, such that the ten lines connecting the center points of the corresponding pair of openings A are parallel to one another. With this construction, each thermoelectric generation tube T can be supported in parallel by the corresponding pair of openings A. In the container 30, the plurality of thermoelectric generation tubes T do not need to be in a parallel relationship, but may be in a "non-parallel" or "skew" relationship.

As shown in FIG. 7B, the plate 36 has channels (which hereinafter may be referred to as "connection grooves") C which are formed so as to interconnect at least two of the openings A in the plate 36. In the example shown in FIG. 7B, the channel C61 interconnects the opening A61 and the opening A62. Any other channel C62 to C65 similarly interconnects two of the openings A in the plate 36. As will be described later, an electrically conductive member is housed in each of the channels C61 to C65.

Figure 8:
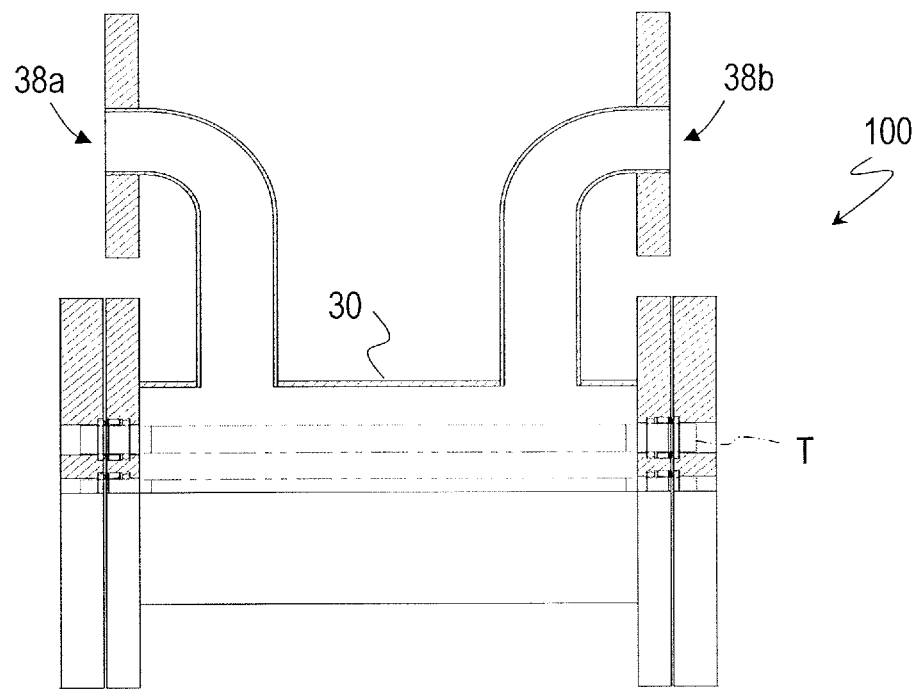
FIG. 8 is a diagram partially showing an M-M cross section in FIG. 7B.

FIG. 8 partially shows an M-M cross section in FIG. 7B. In FIG. 8, a lower half of the container 30 is not shown in cross section; rather, its front is shown. As shown in FIG. 8, the container 30 has the fluid inlet port 38*a* and a fluid outlet port 38*b* for allowing a fluid to flow inside. In the thermoelectric generation unit 100, the fluid inlet port 38*a* and fluid outlet port 38*b* are disposed in an upper portion of the container 30. The place of the fluid inlet port 38*a* is not limited to the upper portion of the container 30, but may be the lower portion of the container 30, for example. The same is also true of the fluid outlet port 38*b*. The fluid inlet port 38*a* and the fluid outlet port 38*b* do not need to be used fixedly as an inlet and an outlet of fluid; the inlet and outlet of fluid may be inverted on a regular or irregular basis. The flow direction of fluid does not need to be fixed. The numbers of the fluid inlet port 38*a* and fluid outlet port 38*b* do not need to be one each; both or one of the fluid inlet port 38*a* and fluid outlet port 38*b* may exist in plurality.

Figure 9:
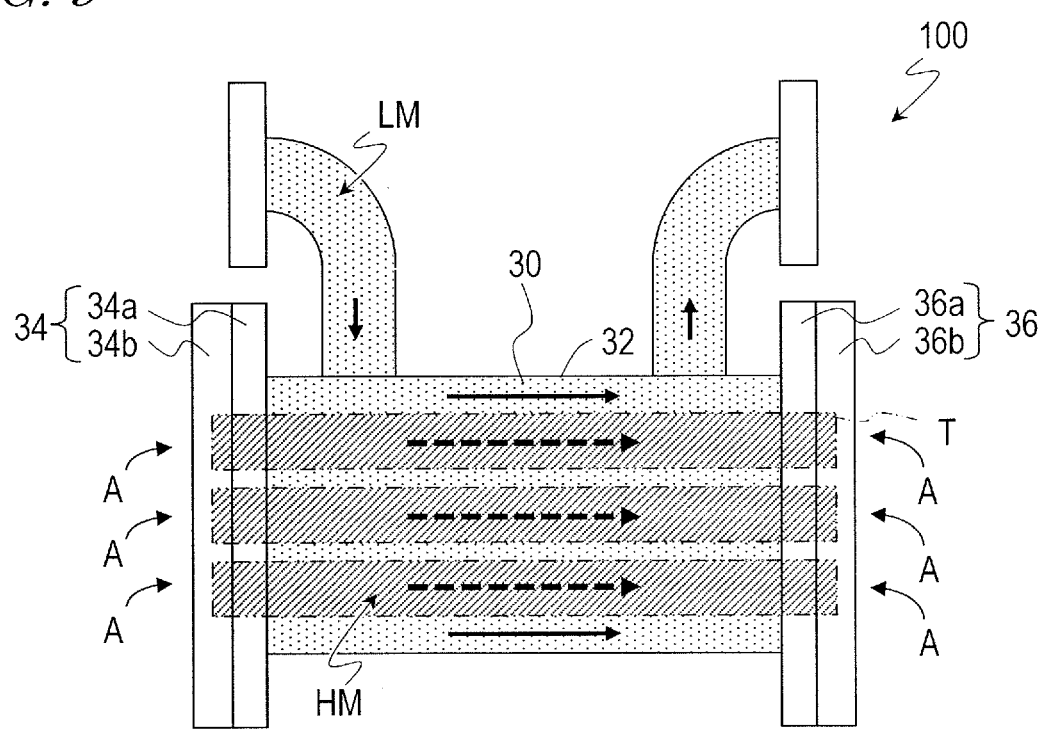
FIG. 9 is a diagram schematically showing an example of flow directions of a hot medium and a cold medium introduced in the thermoelectric generation unit 100.

FIG. 9 is a diagram schematically showing an example of flow directions of the hot medium and the cold medium introduced in the thermoelectric generation unit 100. In the example of FIG. 9, a hot medium HM is supplied in the internal flow path of each of the thermoelectric generation tubes T1 to T10, whereas a cold medium LM is supplied inside the container 30. In this case, via the openings A in the plate 34, the hot medium HM is introduced in the internal flow path of each thermoelectric generation tube. The hot medium HM introduced in the internal flow path of each thermoelectric generation tube comes in contact with the inner peripheral surface of the thermoelectric generation tube. On the other hand, the cold medium LM is introduced inside the container 30 from the fluid inlet port 38a. The cold medium LM introduced inside the container 30 comes in contact with the outer peripheral surface of each thermoelectric generation tube.

In the example shown in FIG. 9, while flowing through the internal flow path of each thermoelectric generation tube, the hot medium HM exchanges heat with the cold medium LM. The hot medium HM whose temperature has lowered through heat exchange with the cold medium LM is discharged to the exterior of the thermoelectric generation unit 100 via the openings A in the plate 36. On the other hand, while flowing inside the container 30, the cold medium LM exchanges heat with the hot medium HM. The cold medium LM whose temperature has increased through heat exchange with the hot medium HM is discharged to the exterior of the thermoelectric generation unit 100 from the fluid outlet port 38b. The flow direction of the hot medium HM and the flow direction of the cold medium LM shown in FIG. 9 are only an example. One or both of the hot medium HM and the cold medium LM may flow from the right to the left in the figure.

In one implementation, the hot medium HM (e.g., hot water) may be introduced in the flow path of each thermoelectric generation tube T, and the cold medium LM (e.g., cooling water) may be introduced from the fluid inlet port 38a to fill the inside of the container 30. Conversely, the cold medium LM (e.g., cooling water) may be introduced in the flow path of each thermoelectric generation tube T, and the hot medium HM (e.g., hot water) may be introduced from the fluid inlet port 38a to fill the inside of the container 30. Thus, a temperature difference which is necessary for power generation can be introduced between the outer peripheral surface 24 and the inner peripheral surface 26 of each thermoelectric generation tube T.

<Implementations of Sealing from Fluids and Electrical Connection Between Thermoelectric Generation Tubes>

Figure 10:
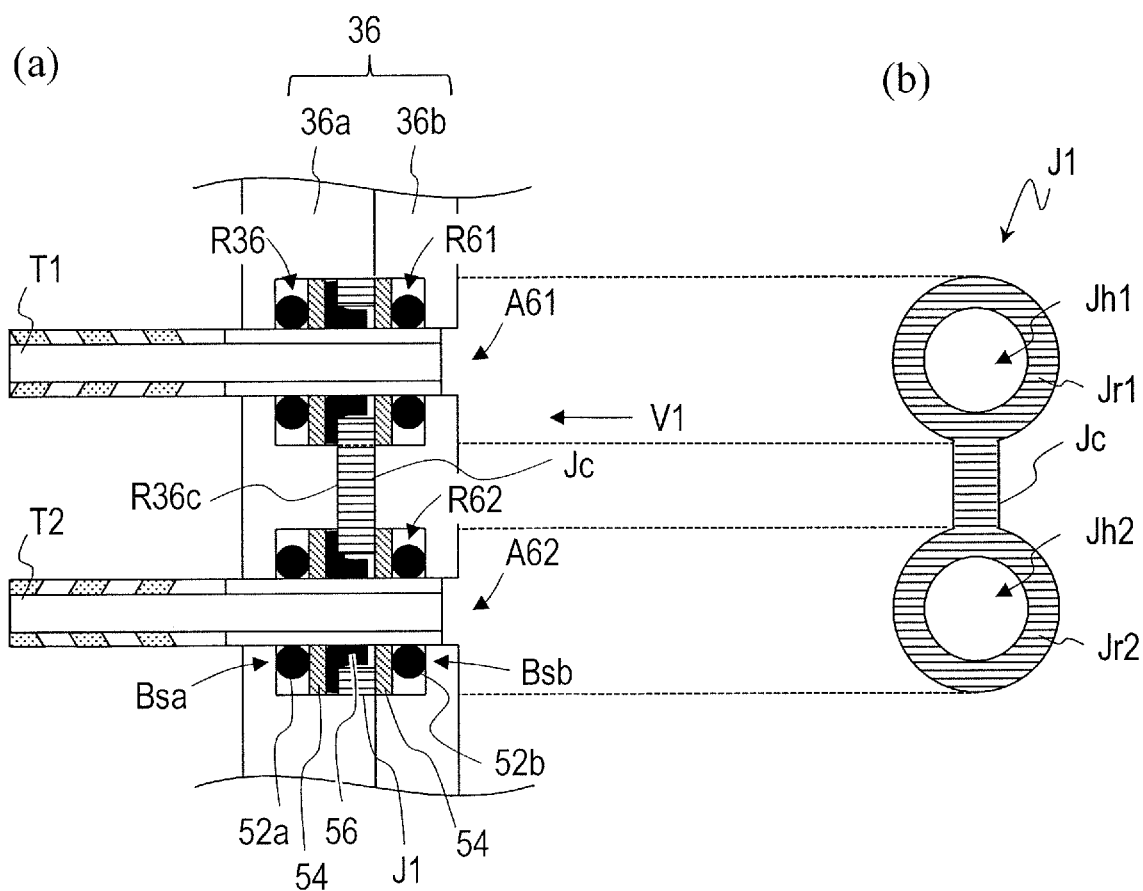
FIG. 10 includes portions (a) and (b), where (a) is a diagram showing a schematic cross section of a portion of a plate 36, and (b) is a diagram showing the appearance of an electrically conductive member J1 as viewed in the direction indicated by the arrow V1 in portion (a).

Portion (a) of FIG. 10 schematically illustrates a partial cross-sectional view of the plate 36. Specifically, portion (a) of FIG. 10 schematically illustrates a cross section of the plate 36 as viewed on a plane containing the center axes of both of two thermoelectric generation tubes T1 and T2. More specifically, portion (a) of FIG. 10 illustrates the structure of openings A61 and A62 among multiple openings A that the plate 36 has and a region surrounding them. Portion (b) of FIG. 10 schematically illustrates the appearance of an electrically conductive member J1 as viewed in the direction indicated by the arrow V1 in portion (a) of FIG. 10. This electrically conductive member J1 has two throughholes Jh1 and Jh2. More specifically, this electrically conductive member J1 includes a first ring portion Jr1 having the throughhole Jh1, a second ring portion Jr2 having the throughhole Jh2, and a connecting portion Jc which connects these two ring portions Jr1 and Jr2 together.

As shown in portion (a) of FIG. 10, one end of the thermoelectric generation tube T1 (on the second electrode side) is inserted into the opening A61 of the plate 36 and one end of the thermoelectric generation tube T2 (on the first electrode side) is inserted into the opening A62. In this state, these ends of the thermoelectric generation tubes T1 and T2 are respectively inserted into the throughholes Jh1 and Jh2 of the electrically conductive member J1. This end of the thermoelectric generation tube T1 (on the second electrode side) and this end of the thermoelectric generation tube T2 (on the first electrode side) are electrically connected together via this electrically conductive member J1. In the present specification, an electrically conductive member to connect two thermoelectric generation tubes electrically together may be referred to as a "connection plate".

It should be noted that the first and second ring portions Jr1 and Jr2 do not need to have an annular shape. As long as electrical connection is established between the thermoelectric generation tubes, the throughhole Jh1 or Jh2 may also have a circular, elliptical or polygonal shape. For example, the shape of the throughhole Jh1 or Jh2 may be different from the cross-sectional shape of the first or second electrode E1 or E2 as viewed on a plane that intersects with the axial direction at right angles. In the present specification, a "ring" shape includes not only an annular shape but also other shapes.

In the example illustrated in portion (a) of FIG. 10, the first plate portion 36a has a recess R36 which has been cut for the openings A61 and A62. The recess R36 includes a groove portion R36c to connect the openings A61 and A62 together. The connecting portion Jc of the electrically conductive member J1 is located in this groove portion R36c. On the other hand, recesses R61 and R62 have been cut in the second plate portion 36b for the openings A61 and A62, respectively. In this example, various members to establish sealing and electrical connection are arranged inside the space formed by these recesses R36, R61 and R62. That space forms a channel C61 to house the electrically conductive member J1 and the openings A61 and A62 are connected together via the channel C61.

In the example illustrated in portion (a) of FIG. 10, not only the electrically conductive member J1 but also a first O-ring 52a, washers 54, an electrically conductive ring member 56 and a second O-ring 52b are housed in the channel C61. The respective ends of the thermoelectric generation tubes T1 and T2 go through the holes of these members. The first O-ring 52a arranged closest to the shell 32 of the container 30 is in contact with the seating surface Bsa that has been formed in the first plate portion 36a and establishes sealing so as to prevent a fluid that has been supplied into the shell 32 from entering the channel C61. On the other hand, the second O-ring 52b arranged most distant from the shell 32 of the container 30 is in contact with a seating surface Bsb that has been formed in the second plate portion 36b and establishes sealing so as to prevent a fluid located outside of the second plate portion 36b from entering the channel C61.

The O-rings 52a and 52b are annular seal members with an O (i.e., circular) cross section. The O-rings 52a and 52b may be made of rubber, metal or plastic, for example, and have the function of preventing a fluid from leaking out, or flowing into, through a gap between the members. In portion (a) of FIG. 10, there is a space which communicates with the flow paths of the respective thermoelectric generation tubes T on the right-hand side of the second plate portion 36b and there is a fluid (the hot or cold medium in this example) in that space. According to the present embodiment, by using the members shown in FIG. 10, electrical connection between the thermoelectric generation tubes T and sealing from the fluids (the hot and cold media) are established. The structure and function of the electrically conductive ring member 56 will be described in detail later.

The same members as those described for the plate 36 are provided for the plate 34, too. Although the respective openings A of the plates 34 and 36 are arranged mirror symmetrically, the groove portions connecting any two openings A together on the plate 34 are not arranged mirror symmetrically with the groove portions connecting any two openings A together on the plate 36. If the arrangement patterns of the electrically conductive members to electrically connect the thermoelectric generation tubes T together on the plates 34 and 36 were mirror symmetric to each other, then those thermoelectric generation tubes T could not be connected together in series.

When a plate (such as the plate 36) fixed onto the shell 32 includes first and second plate portions (36a and 36b) as in the present embodiment, each of the multiple openings A cut through the first plate portion (36a) has a first seating surface (Bsa) associated therewith to receive the first O-ring 52a, and each of the multiple openings A cut through the second plate portion (36b) has a second seating surface (Bsb) to receive the second O-ring 52b. However, the plates 34 and 36 do not need to have the construction shown in FIG. 10, and the plate 36 does not need to be divided into the first and second plate portions 36a and 36b, either. If the electrically conductive member J1 is pressed by another member instead of the second plate portion 36b, the respective first O-rings 52a press against the first seating surface (Bsa) to establish sealing, too.

In the example shown in portion (a) of FIG. 10, the electrically conductive ring member 56 is interposed between the thermoelectric generation tube T1 and the electrically conductive member J1. Likewise, another electrically conductive ring member 56 is interposed between the thermoelectric generation tube T2 and the electrically conductive member J1, too.

The electrically conductive member J1 is typically made of a metal. Examples of materials to compose the electrically conductive member J1 include copper (oxygen-free copper), brass and aluminum. The material may be plated with nickel or tin for anticorrosion purposes. As long as electrical connection is established between the electrically conductive member J (e.g., J1 in this example) and the thermoelectric generation tubes T (e.g., T1 and T2 in this example) inserted into the two throughholes of the electrically conductive member J (e.g., Jh1 and Jh2 in this example), the electrically conductive member J may be partially coated with an insulator. That is, the electrically conductive member J may include a body made of a metallic material and an insulating coating which covers the surface of the body at least partially. The insulating coating may be made of a resin such as TEFLON™, for example. When the body of the electrically conductive member J is made of aluminum, the surface may be partially coated with an oxide skin as an insulating coating.

Figure 11A:
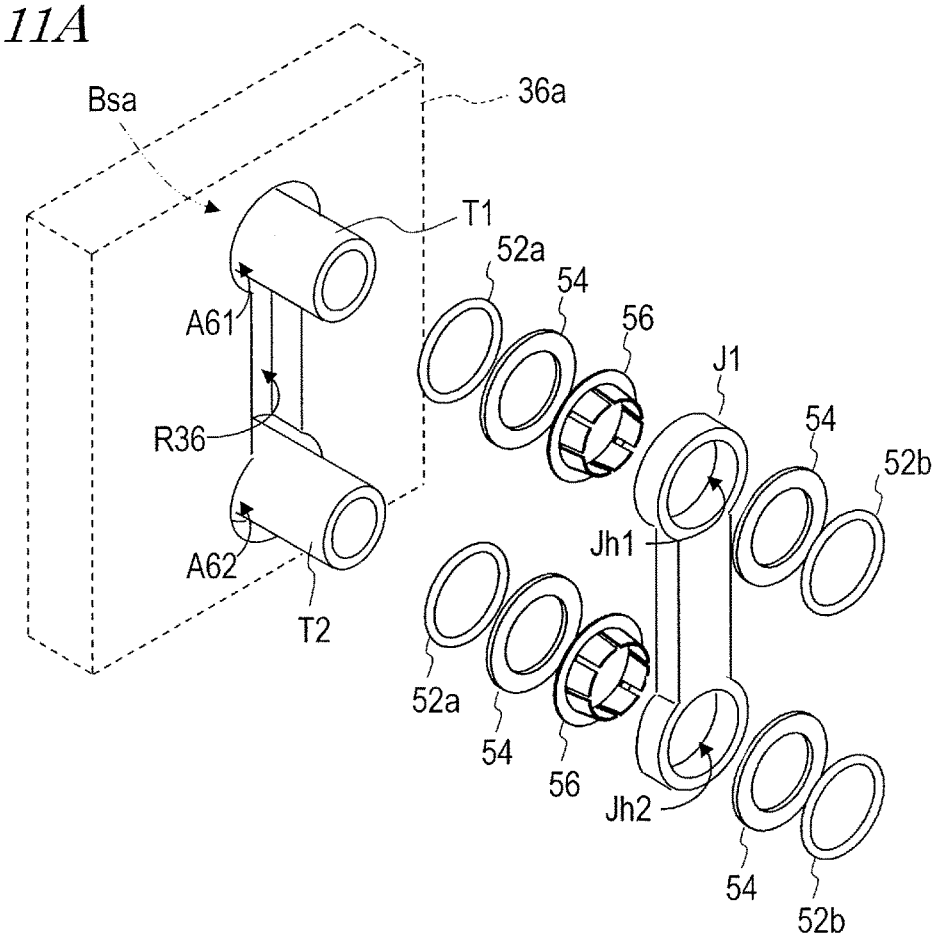
FIG. 11A is a schematic exploded perspective view of a channel C61 to house the electrically conductive member J1 and its vicinity.

FIG. 11A is an exploded perspective view schematically illustrating the channel C61 to house the electrically conductive member J1 and its vicinity. As shown in FIG. 11A, the first O-rings 52a, electrically conductive ring members 56, electrically conductive member J1 and second O-rings 52b are inserted into the openings A61 and A62 from outside of the container 30. In this example, washers 54 are arranged between the first O-rings 52a and the electrically conductive ring members 56. Washers 54 may also be arranged between the electrically conductive member J1 and the second O-rings 52b. The washers 54 are inserted between the flat portions 56f of the electrically conductive ring members 56 to be described later and the O-rings 52a (or 52b).

Figure 11B:
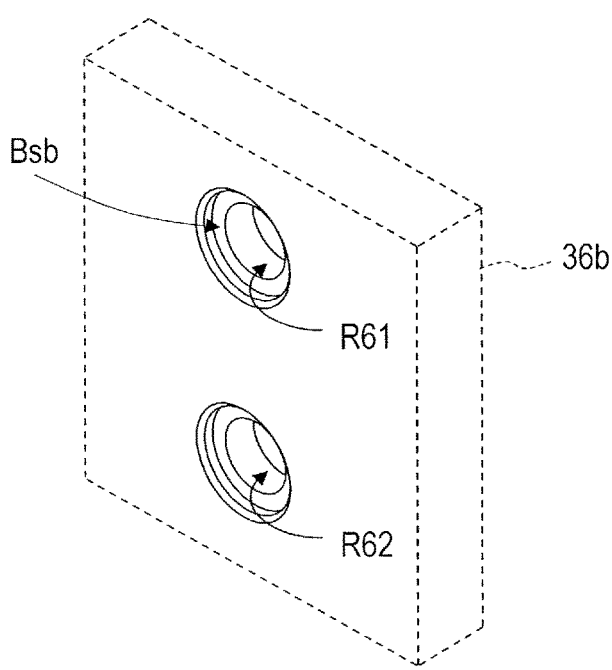
FIG. 11B is a perspective view showing a portion of the sealing surface of the second plate portion 36b (i.e., the surface that faces the first plate portion 36a) associated with openings A61 and A62.

FIG. 11B schematically illustrates a portion of the sealing surface of the second plate portion 36b (i.e., the surface that faces the first plate portion 36a) associated with the openings A61 and A62. As described above, the openings A61 and A62 of the second plate portion 36b each have a seating surface Bsb to receive the second O-ring 52b. Therefore, when the respective sealing surfaces of the first and second plate portions 36a and 36b are arranged to face each other and fastened together by flange connection, for example, the first O-rings 52a in the first plate portion 36a can be pressed against the seating surfaces Bsa. More specifically, the second seating surfaces Bsb press the first O-rings 52a against the seating surfaces Bsa through the second O-rings 52b, electrically conductive member J1 and electrically conductive ring members 56. In this manner, the electrically conductive member J1 can be sealed from the hot and cold media.

When the first and second plate portions 36a and 36b are made of an electrically conductive material such as a metal, the sealing surfaces of the first and second plate portions 36a and 36b may be coated with an insulator material. Parts of the first and second plate portions 36a and 36b to come in contact with the electrically conductive member J during operation may be coated with an insulator so as to be electrically insulated from the electrically conductive member J. In one implementation, the sealing surfaces of the first and second plate portions 36a and 36b may be sprayed and coated with a fluoroethylene resin.

<Detailed Construction for Electrically Conductive Ring Members>

A detailed construction for the electrically conductive ring members 56 will be described with reference to FIGS. 12A and 12B.

Figure 12A:
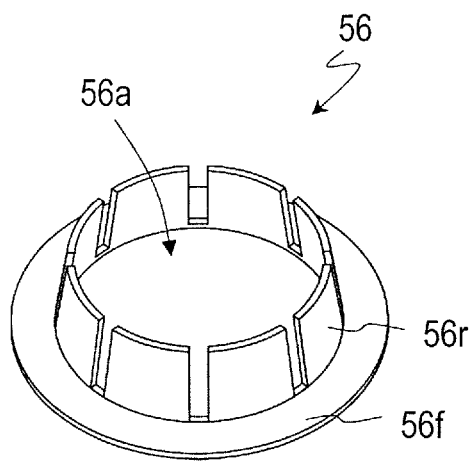
FIG. 12A is a perspective view illustrating an exemplary shape of an electrically conductive ring member 56.

FIG. 12A is a perspective view illustrating an exemplary shape of an electrically conductive ring member 56. The electrically conductive ring member 56 shown in FIG. 12A includes an annular flat portion 56f and a plurality of elastic portions 56r. The flat portion 56f has a throughhole 56a. Those elastic portions 56r project from the periphery of the throughhole 56a of the flat portion 56f and are biased toward the center of the throughhole 56a with elastic force. Such an electrically conductive ring member 56 can be easily made by patterning a single metallic plate (with a thickness of 0.1 mm to a few mm, for example). Likewise, the electrically conductive members J can also be easily made by patterning a single metallic plate (with a thickness of 0.1 mm to a few mm, for example).

An end (on the first or second electrode side) of an associated thermoelectric generation tube T is inserted into the throughhole 56a of each electrically conductive ring member 56. Therefore, the shape and size of the throughhole 56a of the annular flat portion 56f are designed so as to match the shape and size of that end (on the first or second electrode side) of the thermoelectric generation tube T.

Figure 13A:
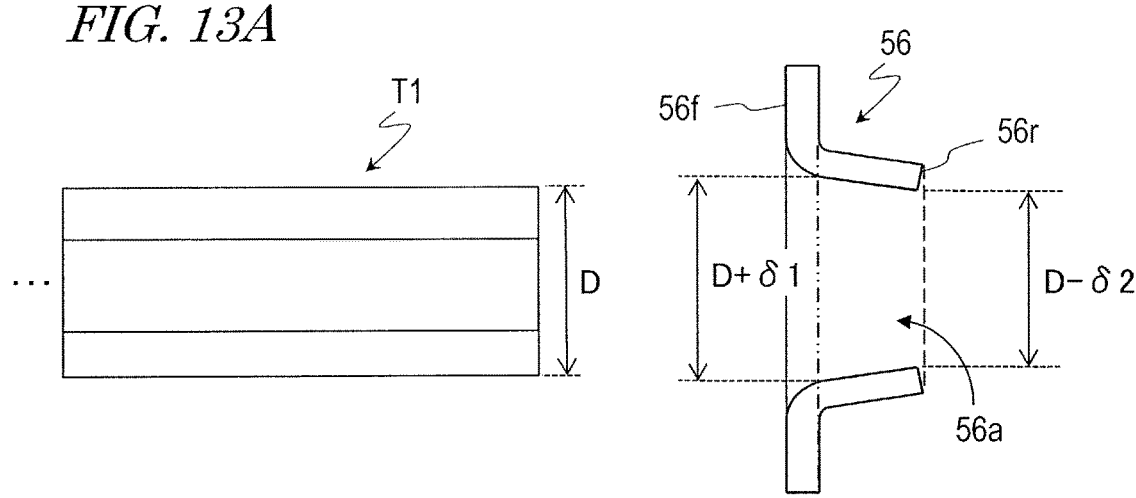
FIG. 13A is a schematic cross-sectional view showing the electrically conductive ring member 56 and the thermoelectric generation tube T1.
Figure 13B:
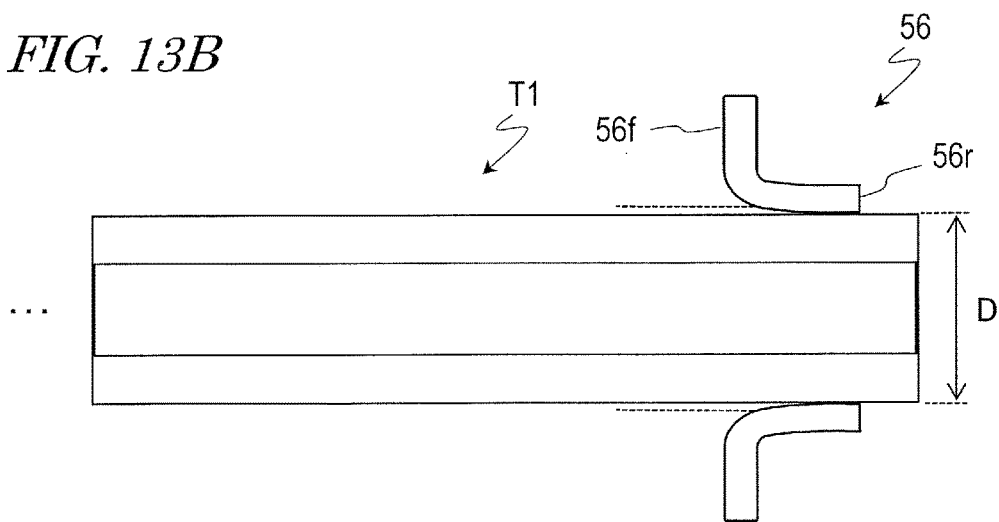
FIG. 13B is a schematic cross-sectional view showing a state where an end of the thermoelectric generation tube T1 has been inserted into the electrically conductive ring member 56.
Figure 13C:
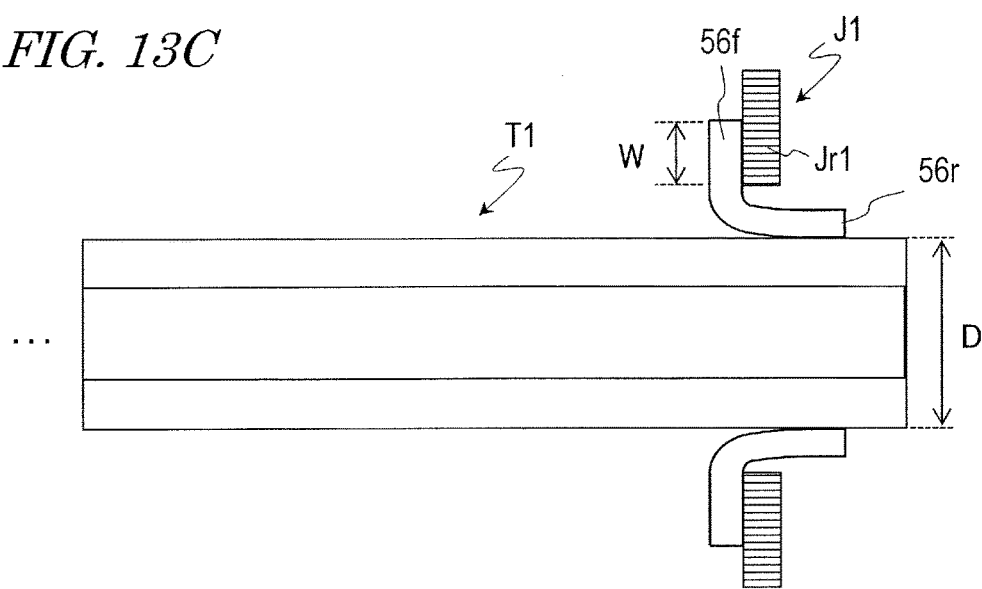
FIG. 13C is a schematic cross-sectional view showing a state where an end of the thermoelectric generation tube T1 has been inserted into the electrically conductive ring member 56 and the electrically conductive member J1.

Next, the shape of the electrically conductive ring member 56 will be described in further detail with reference to FIGS. 13A, 13B and 13C. FIG. 13A is a cross-sectional view schematically illustrating the electrically conductive ring member 56 and portions of the thermoelectric generation tube T1. FIG. 13B is a cross-sectional view schematically illustrating a state where an end of the thermoelectric generation tube T1 has been inserted into the electrically conductive ring member 56. FIG. 13C is a cross-sectional view schematically illustrating a state where an end of the thermoelectric generation tube T1 has been inserted into the respective throughholes of the electrically conductive ring member 56 and electrically conductive member J1. The cross sections illustrated in FIGS. 13A, 13B and 13C are viewed on a plane containing the axis (i.e., the center axis) of the thermoelectric generation tube T1.

Suppose the outer peripheral surface of the thermoelectric generation tube T1 at that end (on the first or second electrode side) is a circular cylinder with a diameter D as shown in FIG. 13A. In that case, the throughhole 56a of the electrically conductive ring member 56 is formed in a circular shape with a diameter D+δ 1 (where δ 1>0) so as to allow the end of the thermoelectric generation tube T1 to pass through. On the other hand, the respective elastic portions 56r have been formed so that biasing force is applied toward the center of the throughhole 56a. The respective elastic portions 56r may be formed so as to be tilted toward the center of the throughhole 56a as shown in FIG. 13A. That is, the elastic portions 56r have been shaped so as to be circumscribed by the outer peripheral surface of a circular cylinder, of which a cross section has a diameter that is smaller than D (and that is represented by D−δ 2 (where δ 2>0)) unless any external force is applied.

D+δ 1>D>D−δ 2 is satisfied. Thus, when the end of the thermoelectric generation tube T1 is inserted into the throughhole 56a, the respective elastic portions 56r are brought into physical contact with the outer peripheral surface at the end of the thermoelectric generation tube T1 as shown in FIG. 13B. Since elastic force is applied to the respective elastic portions 56r toward the center of the throughhole 56a, the respective elastic portions 56r press the outer peripheral surface at the end of the thermoelectric generation tube T1 with the elastic force. In this manner, the outer peripheral surface of the thermoelectric generation tube T1 inserted into the throughhole 56a establishes stabilized physical and electrical contact with those elastic portions 56r.

Next, look at FIG. 13C. Inside the opening A cut through the plate 34, 36, the electrically conductive member J1 is in contact with the flat portion 56f of the electrically conductive ring member 56. More specifically, when the end of the thermoelectric generation tube T1 is inserted into the electrically conductive ring member 56 and electrically conductive member J1, the surface of the flat portion 56f of the electrically conductive ring member 56 is in contact with the surface of the ring portion Jr1 of the electrically conductive member J1 as shown in FIG. 13C. As can be seen, in the present embodiment, the electrically conductive ring member 56 and the electrically conductive member J1 may be electrically connected together by bringing their planes into contact with each other. Since the electrically conductive ring member 56 and the electrically conductive member J1 are in contact with each other on their planes, a contact area which is large enough to make the electric current generated in the thermoelectric generation tube T1 flow can be secured. The width W of the flat portion 56f is set appropriately to secure a contact area which is large enough to make the electric current generated in the thermoelectric generation tube T1 flow. So long as a contact area can be secured between the electrically conductive ring member 56 and the electrically conductive member J1, either the surface of the flat portion 56f or the surface of the ring portion Jr1 of the electrically conductive member J1 may have some unevenness. For example, an even larger area of contact can be secured when the surface of the ring portion Jr1 of the electrically conductive member J1 is allowed to have an embossed pattern matching that on the surface of the flat portion 56f.

Figure 14A:
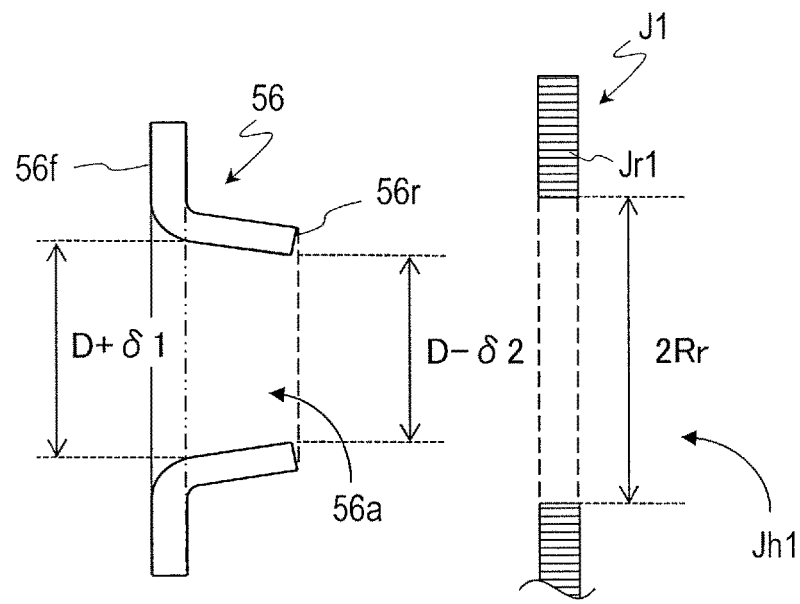
FIG. 14A is a schematic cross-sectional view showing the electrically conductive ring member 56 and a portion of the electrically conductive member J1.
Figure 14B:
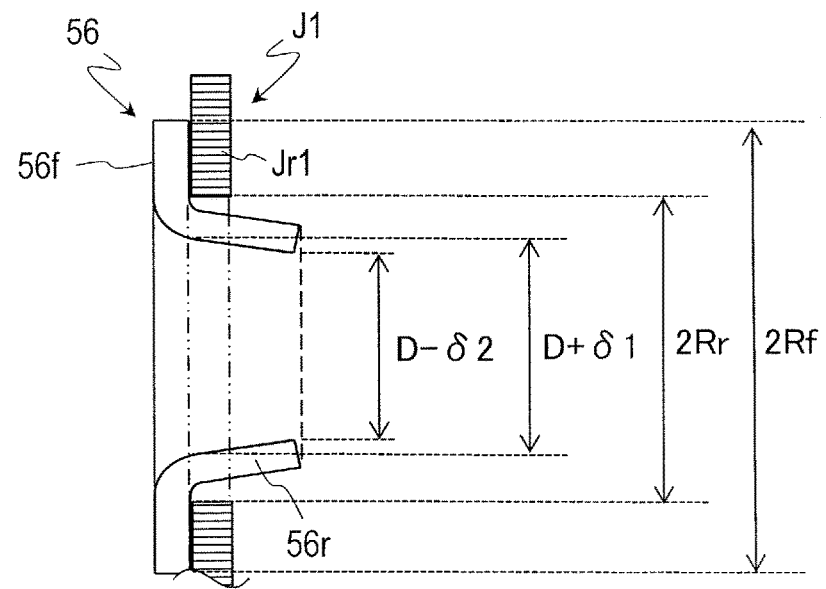
FIG. 14B is a schematic cross-sectional view showing a state where elastic portions 56r of the electrically conductive ring member 56 have been inserted into a throughhole Jh1 of the electrically conductive member J1.

Next, look at FIGS. 14A and 14B. FIG. 14A is a cross-sectional view schematically illustrating the electrically conductive ring member 56 and a portion of the electrically conductive member J1. FIG. 14B is a cross-sectional view schematically illustrating a state where the elastic portions 56r of the electrically conductive ring member 56 have been inserted into the throughhole Jh1 of the electrically conductive member J1. The cross sections shown in FIGS. 14A and 14B are obtained by viewing the electrically conductive ring member 56 and the electrically conductive member J1 on a plane containing the axis (center axis) of the thermoelectric generation tube T1.

Assuming a diameter 2 Rr of the throughhole (e.g., Jh1 in this case) of the electrically conductive member J, the throughhole of the electrically conductive member J is formed so as to satisfy D<2 Rr (i.e., so as to allow the end of the thermoelectric generation tube T1 to pass through). Also, assuming a diameter 2 Rf of the flat portion 56f of the electrically conductive ring member 56, the throughhole of the electrically conductive member J is formed so as to satisfy 2 Rr<2 Rf, so that the respective surfaces of the flat portion 56f and ring portion Jr1 are in contact with each other just as intended.

Figure 15:
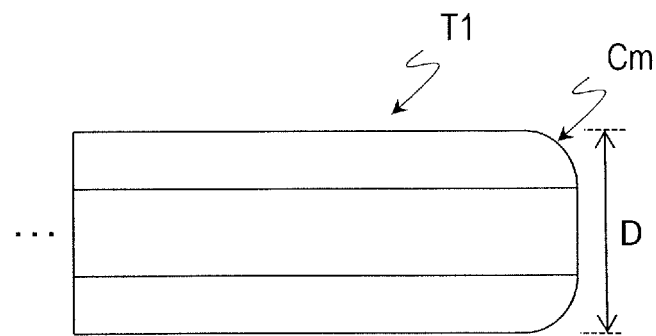
FIG. 15 is a schematic cross-sectional view of a thermoelectric generation tube having a chamfered portion Cm at an end.

Optionally, the end of the thermoelectric generation tube T may have a chamfered portion Cm as shown in FIG. 15. The reason is that, when the end of the thermoelectric generation tube T (e.g., thermoelectric generation tube T1) is inserted into the throughhole 56a of the electrically conductive ring member 56, the elastic portions 56r of the electrically conductive ring member 56 and the end of the thermoelectric generation tube T are in contact with each other, thus possibly damaging the end of the thermoelectric generation tube T. However, by providing such a chamfered portion Cm at the end of the thermoelectric generation tube T, such damage to the end of the thermoelectric generation tube T arising from contact between the elastic portions 56r and the end of the thermoelectric generation tube T can be avoided. By avoiding the occurrence of the damage on the end of the thermoelectric generation tube T, the electrically conductive member J can be sealed more securely from the hot and cold media. In addition, electrical contact failure between the outer peripheral surface of the thermoelectric generation tube T and the elastic portions 56r can also be reduced. The chamfered portion Cm may have a curved surface as shown in FIG. 15, or have a planar surface.

In this example, the electrically conductive member J1 comes in contact with the flat portion 56f of the electrically conductive ring member 56 within the opening A provided in the plate. More specifically, the surface of the first ring portion Jr1 (or the second ring portion Jr2) of the electrically conductive member J1 and the surface of the flat portion 56f of the electrically conductive ring member 56 come in contact with each other. In this manner, the electrically conductive member J1 is electrically connected to the outer peripheral surface at the end of the thermoelectric generation tube T via the electrically conductive ring member 56. According to the present embodiment, by fastening the first and second plate portions 36a and 36b together, the flat portion 56f of the electrically conductive ring member 56 and the electrically conductive member J can make electrical contact with each other with good stability, and sealing described above can be established.

Next, it will be described how the electrically conductive ring member 56 may be fitted into the thermoelectric generation tube T.

First, as shown in FIG. 11A, the respective ends of the thermoelectric generation tubes T1 and T2 are inserted into the openings A61 and A62 of the first plate portion 36a. After that, the first O-rings 52a (and the washers 54 if necessary) are fitted into the thermoelectric generation tubes through their tip ends and pushed deeper into the openings A61 and A62. Next, the electrically conductive ring members 56 are fitted into the thermoelectric generation tubes through their tip ends and pushed deeper into the openings A61 and A62. Subsequently, the electrically conductive member J1 (and the washers 54 and second O-rings 52b if necessary) is/are fitted into the thermoelectric generation tubes through their tip ends and pushed deeper into the openings A61 and A62. Finally, the sealing surface of the second plate portion 36b is arranged to face the first plate portion 36a and the first and second plate portions 36a and 36b are fastened together by flange connection, for example, so that the respective tip ends of the thermoelectric generation tubes are inserted into the openings of the second plate portion 36b. In this case, the first and second plate portions 36a and 36b may be fastened together with bolts and nuts through the holes 36bh cut through the second plate portion 36b (shown in FIG. 7B) and the holes cut through the first plate portion 36a.

The electrically conductive ring member 56 is not connected permanently to, and is readily removable from, the thermoelectric generation tube T. For example, when the thermoelectric generation tube T is replaced with a new thermoelectric generation tube T, to remove the electrically conductive ring member 56 from the thermoelectric generation tube T, the operation of fitting the electrically conductive ring members 56 into the thermoelectric generation tubes T may be performed in reverse order. The electrically conductive ring member 56 may be used a number of times (i.e., is recyclable) or replaced with a new one.

The electrically conductive ring member 56 does not always need to have the exemplary shape shown in FIG. 12A. The ratio of the width of the flat portion 56f (as measured radially) to the radius of the throughhole 56a may also be defined arbitrarily. The respective elastic portions 56r may have any of various shapes, and the number of elastic portions 56r to be provided may be set arbitrarily, too.

Figure 12B:
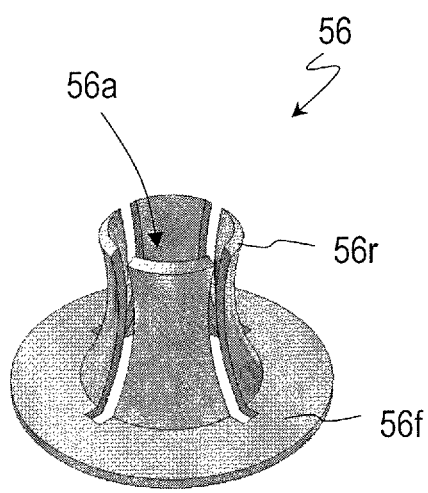
FIG. 12B is a perspective view illustrating another exemplary shape of the electrically conductive ring member 56.

FIG. 12B is a perspective view illustrating another exemplary shape of the electrically conductive ring member 56. The electrically conductive ring member 56 shown in FIG. 12B also has an annular flat portion 56f and a plurality of elastic portions 56r. The flat portion 56f has a throughhole 56a. Each of the elastic portions 56r projects from around the throughhole 56a of the flat portion 56f and is biased toward the center of the throughhole 56a with elastic force. In this example, the number of the elastic portions 56r to provide is four. The number of the elastic portions 56r may be two but is advantageously three or more. For example, six or more elastic portions 56r may be provided.

<Electrical Connection Via Connection Plate>

As described above, the electrically conductive member (connection plate) is housed inside the channel C which has been cut to interconnect at least two of the openings A that have been cut through the plate 36.

Note that the respective ends of the two thermoelectric generation tubes may be electrically connected together without the electrically conductive ring members 56. In that case, the respective ends of the two thermoelectric generation tubes may be electrically connected together via an electric cord, a conductor bar, or electrically conductive paste, for example. If the ends of the two thermoelectric generation tubes are electrically connected together via an electric cord, those ends of the thermoelectric generation tubes and the cord may be electrically connected together by soldering, crimping or crocodile-clipping, for example.

However, by connecting the respective ends of the two thermoelectric generation tubes via the electrically conductive member J that is housed in the channel C as shown in FIGS. 10, 11A and 11B, the respective ends of the thermoelectric generation tubes can be electrically connected together more stably. When the electrically conductive member J has a flat plate shape (e.g., when the connecting portion Jc has a broad width), the electrical resistance between the two thermoelectric generation tubes can be reduced compared to a situation where an electric cord is used. In addition, since no terminals are fixed onto the ends of the thermoelectric generation tubes T, the thermoelectric generation tubes T can be replaced easily. Alternatively, with the electrically conductive ring members 56, the respective ends of the two thermoelectric generation tubes can be not only fixed to each other but also electrically connected together.

It should be noted that according to such an arrangement in which the flat-plate electrically conductive member J is brought into contact with the flat portion 56f of the electrically conductive ring member 56, some gap (or clearance) may be left between the throughhole inside the ring portion of the electrically conductive member J and the thermoelectric generation tube to be inserted into the hole. Thus, even if the thermoelectric generation tube is made of a brittle material, the thermoelectric generation tube can also be connected with good stability without allowing the ring portion Jr1 of the electrically conductive member J to damage the thermoelectric generation tube.

In the thermoelectric generation unit 100, the plate 34 or 36 has the channel C formed so as to connect together at least two of the openings A. Thus, an electrical connecting function which has never been provided by any tube sheet for a heat exchanger is realized. In addition, since the thermoelectric generation unit 100 can be constructed so that the first and second O-rings 52a and 52b press the seating surfaces Bsa and Bsb, respectively, sealing can be established so that either airtight or watertight condition is maintained with the ends of the thermoelectric generation tubes T inserted. As can be seen, by providing the channel C for the plate 34 or 36, even in an implementation in which the electrically conductive ring members 56 are omitted, the ends of the two thermoelectric generation tubes can also be electrically connected together and sealing from the fluids (e.g., the hot and cold media) can also be established.

<Relationship Between the Direction of Heat Flow and the Direction of Inclination of Planes of Stacking>

Now, with reference to FIGS. 16A and 16B, the relationship between the direction of heat flow in each thermoelectric generation tube T and the direction of inclination of the planes of stacking in the thermoelectric generation tube T will be described.

Figure 16A:
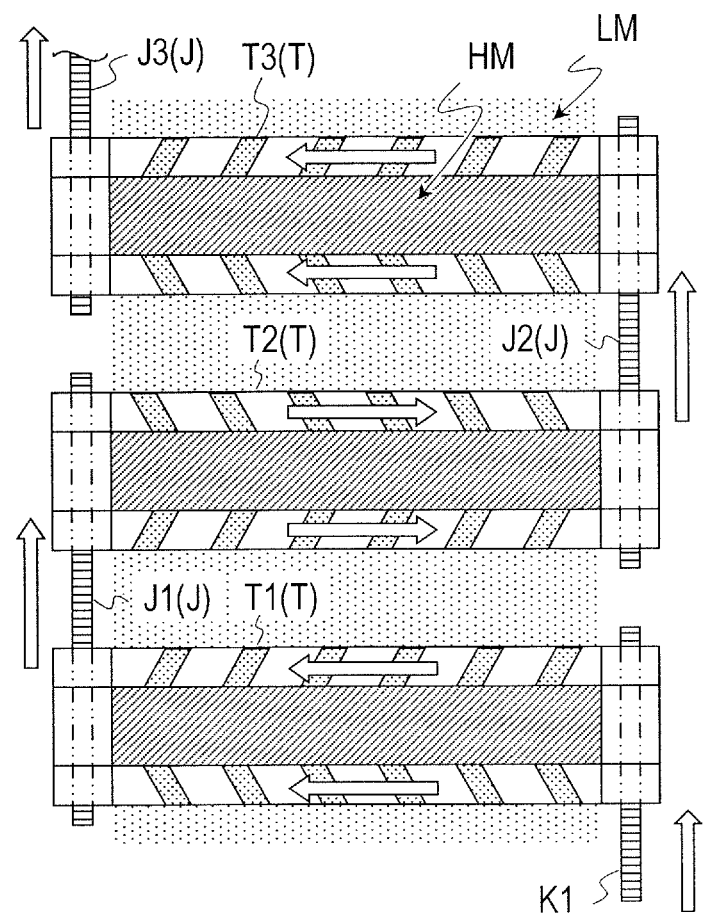
FIG. 16A is a diagram schematically showing directions of an electric current flowing in thermoelectric generation tubes T which are connected in electrical series.

FIG. 16A is a diagram schematically showing an electric current flowing in thermoelectric generation tubes T which are connected in electrical series. FIG. 16A schematically shows cross sections of three (T1 to T3) of the thermoelectric generation tubes T1 to T10.

In FIG. 16A, an electrically conductive member K1 is connected to one end of the thermoelectric generation tube T1 (e.g., the end at the first electrode side), whereas the electrically conductive member (connection plate) J1 is connected to the other end (e.g., the end at the second electrode side) of the thermoelectric generation tube T1. The electrically conductive member J1 is also connected to one end (i.e., the end at the first electrode side) of the thermoelectric generation tube T2, whereby the thermoelectric generation tube T1 and the thermoelectric generation tube T2 are electrically connected. Furthermore, the other end (i.e., the end of the second electrode) of the thermoelectric generation tube T2 and one end (i.e., the end at the first electrode side) of the thermoelectric generation tube T3 are electrically connected by the electrically conductive member J2.

In this case, as shown in FIG. 16A, the direction of inclination of the planes of stacking in the thermoelectric generation tube T2 is opposite to the direction of inclination of the planes of stacking in the thermoelectric generation tube T1. Similarly, the direction of inclination of the planes of stacking in the thermoelectric generation tube T3 is opposite to the direction of inclination of the planes of stacking in the thermoelectric generation tube T2. In other words, in the thermoelectric generation unit 100, between each thermoelectric generation tube T1 to T10 and the thermoelectric generation tube that is connected thereto via a connection plate, the direction of inclination of the planes of stacking is reversed.

Now, assume that the hot medium HM is placed in contact with the inner peripheral surface of each of the thermoelectric generation tubes T1 to T3, and the cold medium LM in contact with their outer peripheral surface, as shown in FIG. 16A. Then, in the thermoelectric generation tube T1, an electric current flows from the right to the left in the figure, for example. On the other hand, in the thermoelectric generation tube T2, in which the direction of inclination of the planes of stacking is opposite from that of the thermoelectric generation tube T1, an electric current flows from the left to the right in the figure.

Figure 17:
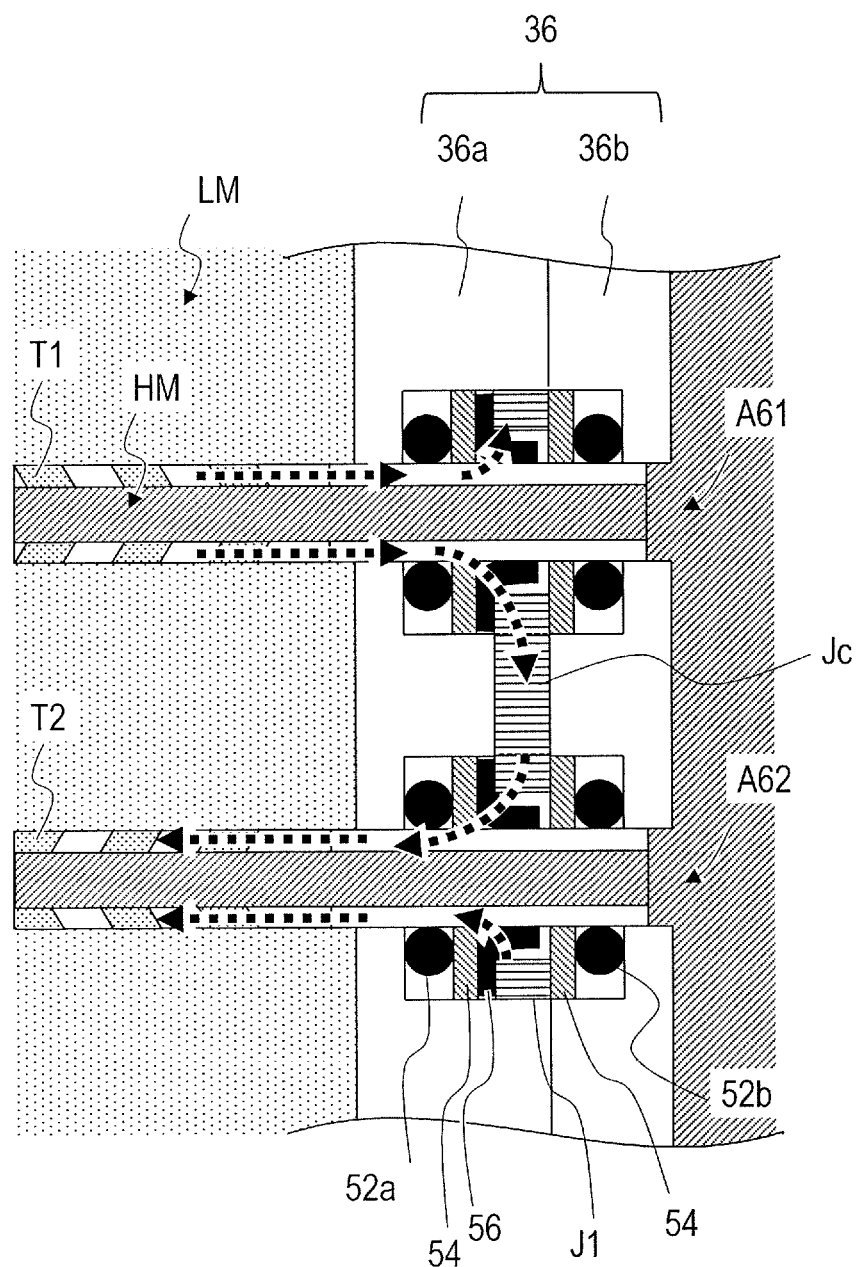
FIG. 17 is a diagram schematically showing the directions of an electric current in two openings A61 and A62 and their vicinity.

FIG. 17 schematically shows the directions in which an electric current flows through the two openings A61 and A62 and their surrounding region. FIG. 17 is a drawing corresponding to the portion (a) of FIG. 10. In FIG. 17, the flow directions of the electric current are schematically indicated by dotted arrows. As shown in FIG. 17, the electric current generated in the thermoelectric generation tube T1 flows toward the thermoelectric generation tube T2 through the electrically conductive ring member 56 in the opening A61, the electrically conductive member J1, and the electrically conductive ring member 56 in the opening A62 in this order. The electric current that has flowed into the thermoelectric generation tube T2 is combined with electric current generated in the thermoelectric generation tube T2, and the electric current thus combined flows toward the thermoelectric generation tube T3. As shown in FIG. 16A, the planes of stacking of the thermoelectric generation tube T3 are tilted in the opposite direction from those of the thermoelectric generation tube T2. Thus, in the thermoelectric generation tube T3, the electric current flows from the right to the left in FIG. 16A. Consequently, the electromotive forces generated in the respective thermoelectric generation tubes T1 to T3 become superposed upon one another, without canceling one another. By sequentially connecting a plurality of thermoelectric generation tubes T together in this manner so that the tilt direction of their planes of stacking is alternately inverted between generators, an even greater voltage can be extracted from the thermoelectric generation unit.

Figure 16B:
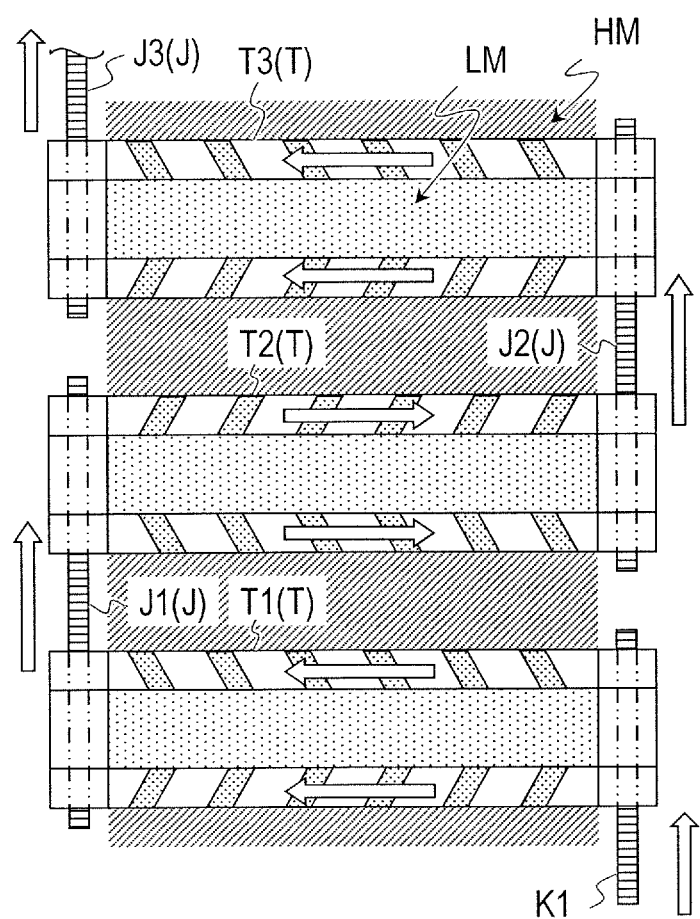
FIG. 16B is a diagram schematically showing directions of an electric current flowing in thermoelectric generation tubes T which are connected in electrical series.

Next, FIG. 16B is referred to. Similarly to FIG. 16A, FIG. 16B schematically shows directions of an electric current flowing in thermoelectric generation tubes T which are connected in electrical series. As in the example shown in FIG. 16A, FIG. 16B illustrates a case where the thermoelectric generation tubes T1 to T3 are consecutively connected so that the direction of inclination of the planes of stacking is alternately opposite. In this case, too, the direction of inclination of the planes of stacking is reversed between every two interconnected thermoelectric generation tubes, so that the electromotive forces occurring in the thermoelectric generation tubes T1 to T3 do not cancel one another, but are superposed.

FIG. 16A is referred to again. If the direction of temperature gradient in each thermoelectric generation tube is inverted, the polarity of the electromotive force in each thermoelectric generation tube (which may also be said to be the direction of the electric current flowing through each thermoelectric generation tube) is inverted. For example, assume that the cold medium LM is placed in contact with the inner peripheral surface of each of the thermoelectric generation tubes T1 to T3 and the hot medium HM in contact with their outer peripheral surface (as shown in FIG. 16B). In that case, the polarities of voltages occurring in the respective thermoelectric generation tubes T1 to T3 become opposite to those illustrated in FIG. 16A. In order to ensure that an electric current flows from the electrically conductive member K1 to the electrically conductive member J3, the first electrode side and the second electrode side of each of the thermoelectric generation tubes T1 to T3 are to be reversed from the state illustrated in FIG. 16A as shown in FIG. 16B. Note that electric current directions illustrated in FIGS. 16A and 16B are mere examples. Depending on the material composing the metal layers 20 and the thermoelectric material composing the thermoelectric material layers 22, the electric current directions may become opposite to the electric current directions shown in FIGS. 16A and 16B.

As already described with reference to FIGS. 16A and 16B, the polarity of the voltage generated in a thermoelectric generation tube T depends on the tilt direction of the planes of stacking of that thermoelectric generation tube T. Therefore, when the thermoelectric generation tube T is to be replaced, for example, the thermoelectric generation tube T needs to be appropriately arranged by taking into account the temperature gradient between the inner and outer peripheral surfaces of the thermoelectric generation tube T in the thermoelectric generation unit 100.

Figure 18A:
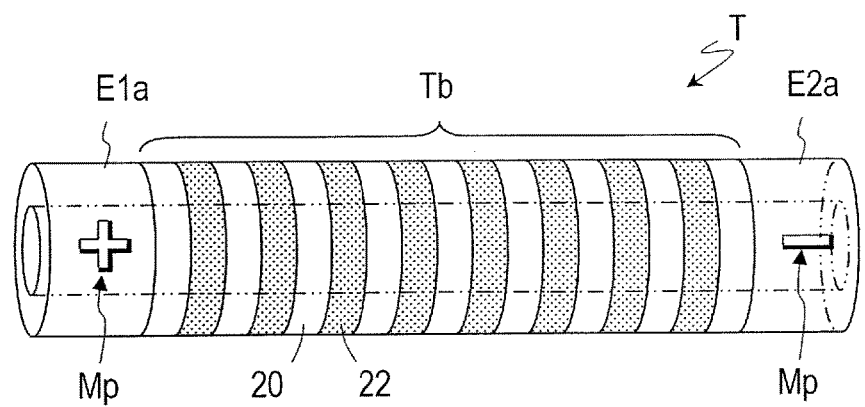
FIG. 18A is a perspective view showing a thermoelectric generation tube, the electrodes of which have indicators of their polarity.
Figure 18B:
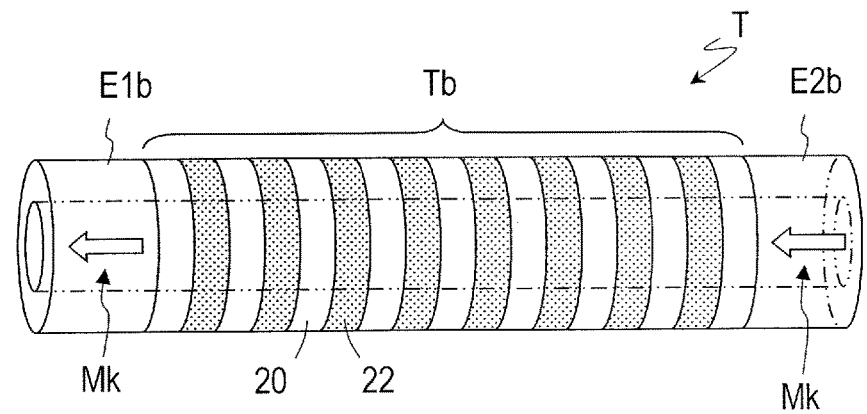
FIG. 18B is a perspective view showing a thermoelectric generation tube, the electrodes of which have indicators of their polarity.

FIGS. 18A and 18B are perspective views each illustrating an exemplary thermoelectric generation tube, the electrodes of which have indicators of their polarity. In the thermoelectric generation tube T shown in FIG. 18A, molded portions (embossed marks) Mp indicating the polarity of the voltage generated in the thermoelectric generation tube are formed on the first and second electrodes E1a and E2a. On the other hand, in the thermoelectric generation tube T shown in FIG. 18B, marks Mk indicating whether the planes of stacking in the thermoelectric generation tube T are tilted toward the first electrode E1b or the second electrode E2b are provided on the first and second electrodes E1b and E2b. These molded portions (e.g., convex or concave portions) and marks may be combined together. These molded portions and marks may be added to the tube body Tb, or to only one of the first and second electrodes.

In this manner, molded portions or marks indicating the polarity of the voltage generated in the thermoelectric generation tube T may be added to the first and second electrodes, for example. In that case, it can be known from the appearance of the thermoelectric generation tube T whether the planes of stacking of the thermoelectric generation tube T are tilted toward the first electrode or the second electrode. Instead of adding such molded portions or marks, the first and second electrodes may be given mutually different shapes. For example, difference may be introduced between the first and second electrodes with respect to their lengths, thicknesses or cross-sectional shapes as viewed on a plane that intersects with the axial direction at right angles.

<Electrical Connection Structure for Retrieving Electric Power to the Exterior of the Thermoelectric Generation Unit 100>

FIG. 5 is referred to again. In the example shown in FIG. 5, ten thermoelectric generation tubes T1 to T10 are connected in electrical series by the electrically conductive members J1 to J9. The connection between two thermoelectric generation tubes T provided by each of the electrically conductive members J1 to J9 is as described above. Hereinafter, an example electrical connection structure for retrieving electric power to the exterior of the thermoelectric generation unit 100 from the two generation tubes T1 and T10 located at both ends of the series circuit will be described.

Figure 19:
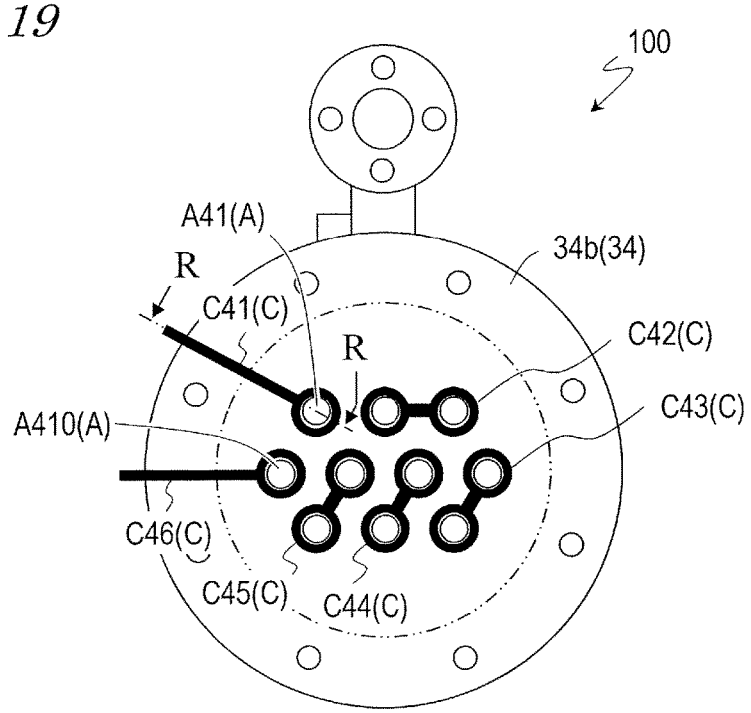
FIG. 19 is a diagram showing the other side face of the thermoelectric generation unit 100 shown in FIG. 7A (left side view).

FIG. 19 is referred to. FIG. 19 is a diagram showing the other side face of the thermoelectric generation unit 100 shown in FIG. 7A (left side view). While FIG. 7B shows construction around the plate 36, FIG. 19 shows construction around the plate 34. Description of any constituent or operation that has been described with respect to the plate 36 will not be repeated.

As shown in FIG. 19, the channels C42 to C45 interconnect at least two of the openings A provided in the plate 34. In the present specification, such channels may be referred to as "interconnections". The electrically conductive members housed in these interconnections have similar construction to that of the electrically conductive member J1. On the other hand, the channel C41 in the plate 34 extends from the opening A41 to the outer edge of the plate 34. In the present specification, a channel which extends from an opening in a plate to its outer edge may be referred to as a "terminal connection". The channels C41 and C46 shown in FIG. 19 are terminal connections. In each terminal connection, the electrically conductive member functioning as a terminal for connecting to an external circuit is housed.

Figure 20:
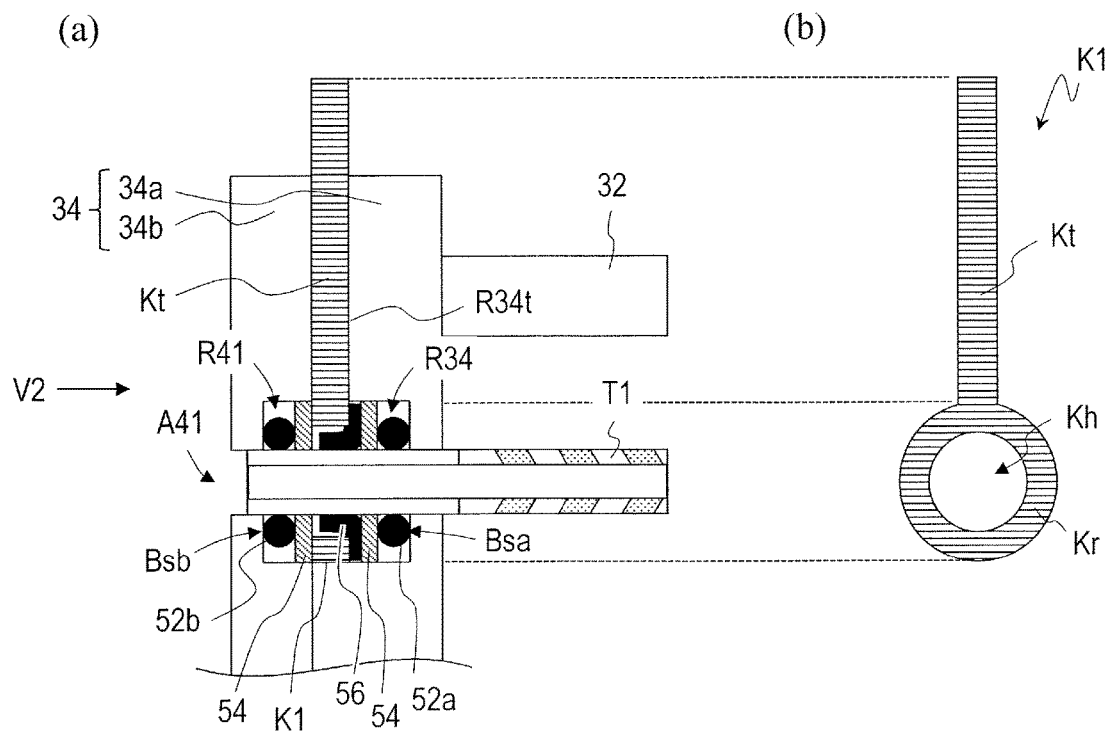
FIG. 20 includes portions (a) and (b), where (a) is a diagram showing a schematic cross section of a portion of the plate 34, and (b) is a diagram showing the appearance of an electrically conductive member K1 as viewed in the direction indicated by the arrow V2 in portion (a).

Portion (a) of FIG. 20 is a schematic partial cross-sectional view of the plate 34. Specifically, portion (a) of FIG. 20 schematically illustrates a cross section of the plate 34 as viewed on a plane containing the center axis of the thermoelectric generation tube T1 and corresponding to the plane R-R shown in FIG. 19. More specifically, portion (a) of FIG. 20 illustrates the structure of one A41 of multiple openings A in the plate 34 and its surrounding region. Portion (b) of FIG. 20 illustrates the appearance of an electrically conductive member K1 as viewed in the direction indicated by the arrow V2 in portion (a) of FIG. 20. This electrically conductive member K1 has a throughhole Kh at one end. More specifically, this electrically conductive member K1 includes a ring portion Kr with the throughhole Kh and a terminal portion Kt extending outward from the ring portion Kr. Similarly to the electrically conductive member J1, this electrically conductive member K1 is also typically made of a metal.

As shown in portion (a) of FIG. 20, one end of the thermoelectric generation tube T1 (on the first electrode side) is inserted into the opening A41 of the plate 34. In this state, the end of the thermoelectric generation tube T1 is inserted into the throughhole Kh of the electrically conductive member K1. As can be seen, an electrically conductive member J or K1 according to the present embodiment can be said to be an electrically conductive plate with at least one hole to allow the thermoelectric generation tube T to pass through. The structure of the opening A410 and its surrounding region is the same as that of the opening A41 and its surrounding region except that the end of the thermoelectric generation tube T10 is inserted into the opening A410 of the plate 34.

In the example illustrated in portion (a) of FIG. 20, the first plate portion 34a has a recess R34 which has been cut for the opening A41. The recess R34 includes a groove portion R34t which extends from the opening A41 to the outer edge of the first plate portion 34a. In this groove portion R34t, the terminal portion Kt of the electrically conductive member K1 is located. In this example, the space defined by the recess R34 and a recess R41 which has been cut in the second plate portion 34b forms a channel to house the electrically conductive member K1. As in the example illustrated in portion (a) of FIG. 10, not only the electrically conductive member K1 but also a first O-ring 52a, washers 54, an electrically conductive ring member 56 and a second O-ring 52b are housed in the channel C41 in the example illustrated in portion (a) of FIG. 20, too. The end of the thermoelectric generation tube T1 goes through the holes of these members. The first O-ring 52a establishes sealing so as to prevent a fluid that has been supplied into the shell 32 from entering the channel C41. On the other hand, the second O-ring 52b establishes sealing so as to prevent a fluid located outside of the second plate portion 34b from entering the channel C41.

Figure 21:
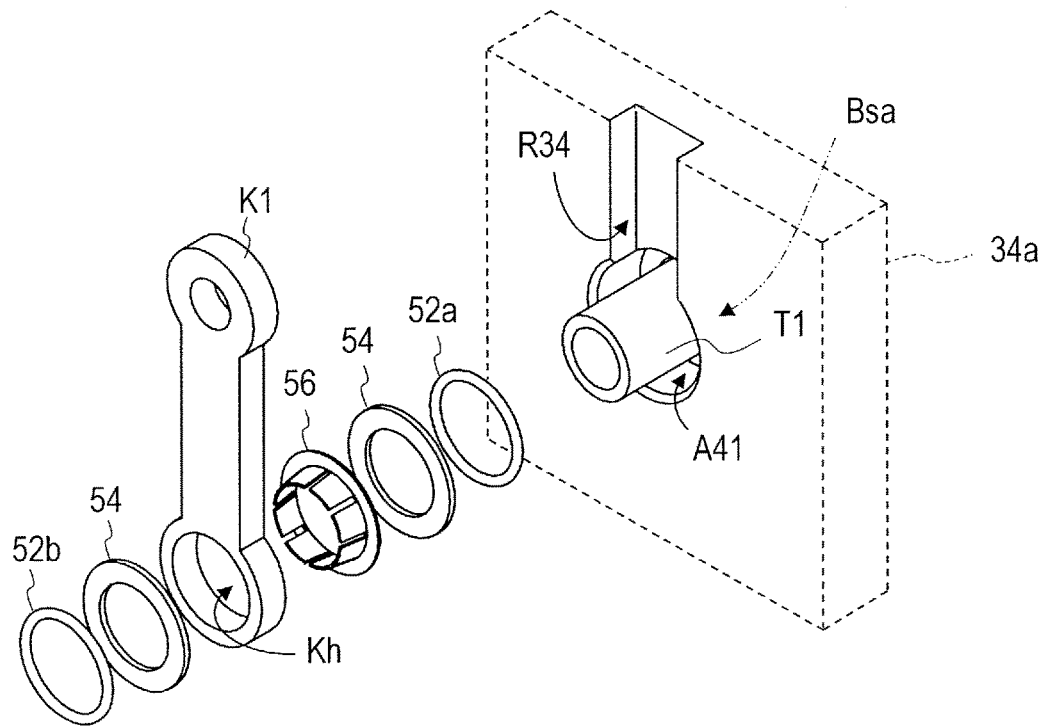
FIG. 21 is a schematic exploded perspective view showing a channel C41 to house the electrically conductive member K1 and its vicinity.

FIG. 21 is an exploded perspective view schematically illustrating the channel C41 to house the electrically conductive member K1 and its vicinity. For example, a first O-ring 52a, a washer 54, an electrically conductive ring member 56, the electrically conductive member K1, another washer 54 and a second O-ring 52b may be inserted into the opening A41 from outside of the container 30. The sealing surface of the second plate portion 34b (i.e., the surface that faces the first plate portion 34a) has substantially the same construction as the sealing surface of the second plate portion 36b shown in FIG. 11B. Thus, by fastening the first and second plate portions 34a and 34b together, the second seating surface Bsb of the second plate portion 34b presses the first O-ring 52a against the seating surface Bsa of the first plate portion 34a through the second O-ring 52b, electrically conductive member K1 and electrically conductive ring member 56. In this manner, the electrically conductive member K1 can be sealed from the hot and cold media.

The ring portion Kr of the electrically conductive member K1 is in contact with the flat portion 56f of the electrically conductive ring member 56 inside the opening A cut through the plate 34. In this manner, the electrically conductive member K1 is electrically connected to the outer peripheral surface at the end of the thermoelectric generation tube T via the electrically conductive ring member 56. In this case, one end of the electrically conductive member K1 (i.e., the terminal portion Kt) sticks out of the plate 34 as shown in portion (a) of FIG. 20. Thus, the portion of the terminal portion Kt that protrudes to the exterior of the plate 34 functions as a terminal for connecting the thermoelectric generation unit to the external circuit. As shown in FIG. 21, the portion of the terminal portion Kt that protrudes to the exterior of the plate 34 may be formed in an annular shape. In the present specification, an electrically conductive member having a thermoelectric generation tube inserted to one end thereof, and the other end of which protrudes to the exterior, may be referred to as a "terminal plate".

Thus, in the thermoelectric generation unit 100, the thermoelectric generation tube T1 and the thermoelectric generation tube T10 are respectively connected to two terminal plates which are housed in the terminal connections. Moreover, the plurality of thermoelectric generation tubes T1 to T10 are connected in electrical series between the two terminal plates, via the connection plates housed in the channel interconnections. Therefore, via the two terminal plates whose one end protrudes to the exterior of plate (e.g., plate 34), the electric power which is generated by the plurality of thermoelectric generation tubes T1 to T10 can be retrieved to the exterior.

The arrangements of the electrically conductive ring member 56 and electrically conductive member J, K1 may be changed appropriately inside the channel C. In that case, the electrically conductive ring member 56 and the electrically conductive member (J, K1) may be arranged so that the elastic portions 56r of the electrically conductive ring member 56 are inserted into the throughhole Jh1, Jh2 or Kh of the electrically conductive member. Also, in an implementation in which the electrically conductive ring member 56 is omitted, the end of the thermoelectric generation tube T may be electrically connected to the electrically conductive member K1. Optionally, part of the flat portion 56f of the electrically conductive ring member 56 may be extended and used in place of the terminal portion Kt of the electrically conductive member K1. In that case, the electrically conductive member K1 may be omitted.

In the embodiments described above, a channel C is formed by respective recesses cut in the first and second plate portions. However, the channel C may also be formed by a recess which has been cut in one of the first and second plate portions. If the container 30 is made of a metallic material, the inside of the channel C may be coated with an insulator to prevent electrical conduction between the electrically conductive members (i.e., the connection plates and the terminal plates) and the container 30. For example, the plate 34 (consisting of the plate portions 34a and 34b) may be comprised of a body made of a metallic material and an insulating coating which covers the surface of the body at least partially. Likewise, the plate 36 (consisting of the plate portions 36a and 36b) may also be comprised of a body made of a metallic material and an insulating coating which covers the surface of the body at least partially. If the respective surfaces of the recesses cut in the first and second plate portions are coated with an insulator, the insulating coating can be omitted from the surface of the electrically conductive member.

<Another Exemplary Structure to Establish Sealing and Electrical Connection>

Figure 22:
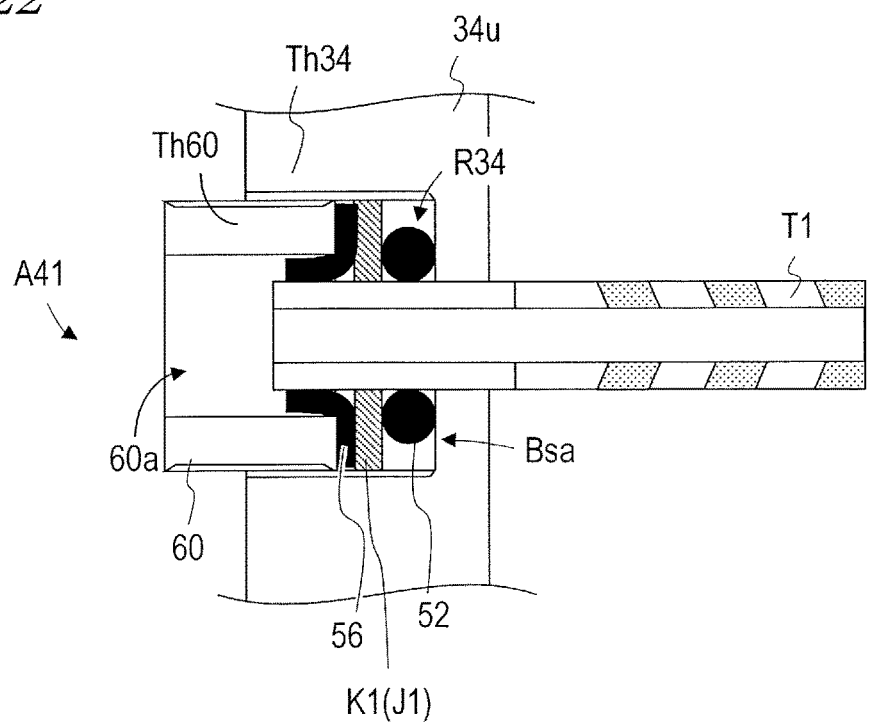
FIG. 22 is a schematic cross-sectional view showing an exemplary structure for separating the medium which flows in contact with the outer peripheral surfaces of the thermoelectric generation tubes T from the medium which flows in contact with the inner peripheral surface of each of the thermoelectric generation tubes T1 to T10 so as to prevent those media from mixing together.

FIG. 22 is a cross-sectional view schematically illustrating an exemplary structure for separating the medium which flows in contact with the outer peripheral surfaces of the thermoelectric generation tubes T from the medium which flows in contact with the inner peripheral surface of each of the thermoelectric generation tubes T1 to T10 so as to prevent those media from mixing together. In the example illustrated in FIG. 22, a bushing 60 is inserted from outside of the container 30, thereby separating the hot and cold media from each other and electrically connecting the thermoelectric generation tube and the electrically conductive member together.

In the example illustrated in FIG. 22, the opening A41 cut through the plate 34u has an internal thread portion Th34. More specifically, the wall surface of the recess R34 that has been cut with respect to the opening A41 of the plate 34u is threaded. The bushing 60 with an external thread portion Th60 is inserted into the recess R34. The bushing 60 has a throughhole 60a that runs in the axial direction. In this case, the end of the thermoelectric generation tube T1 has been inserted into the opening A41 of the plate 34u. Thus, when the bushing 60 is inserted into the recess R34, the throughhole 60a communicates with the internal flow path of the thermoelectric generation tube T1.

Inside the space left between the recess R34 and the bushing 60, various members are arranged to establish sealing and electrical connection. In the example illustrated in FIG. 22, an O-ring 52, the electrically conductive member K1 and the electrically conductive ring member 56 are arranged in this order from the seating surface Bsa of the plate 34u toward the outside of the container 30. The end of the thermoelectric generation tube T1 is inserted into the respective holes of these members. The O-ring 52 is in contact with the seating surface Bsa of the plate 34u and the outer peripheral surface at the end of the thermoelectric generation tube T1. In this case, when the external thread portion Th60 is inserted into the internal thread portion Th34, the external thread portion Th60 presses the O-ring 52 against the seating surface Bsa via the flat portion 56f of the electrically conductive ring member 56 and the electrically conductive member K1. As a result, sealing can be established so as to prevent the fluid supplied into the shell 32 and the fluid supplied into the internal flow path of the thermoelectric generation tube T1 from mixing with each other. In addition, since the outer peripheral surface of the thermoelectric generation tube T1 is in contact with the elastic portions 56r of the electrically conductive ring member 56 and since the flat portion 56f of the electrically conductive ring member 56 is in contact with the ring portion Kr of the electrically conductive member K1, the thermoelectric generation tube and the electrically conductive member can be electrically connected together.

Thus, by using the members shown in FIG. 22, the hot and cold media can be separated from each other, and the thermoelectric generation tube and the electrically conductive member can be electrically connected together with a simpler construction.

Figure 23A:
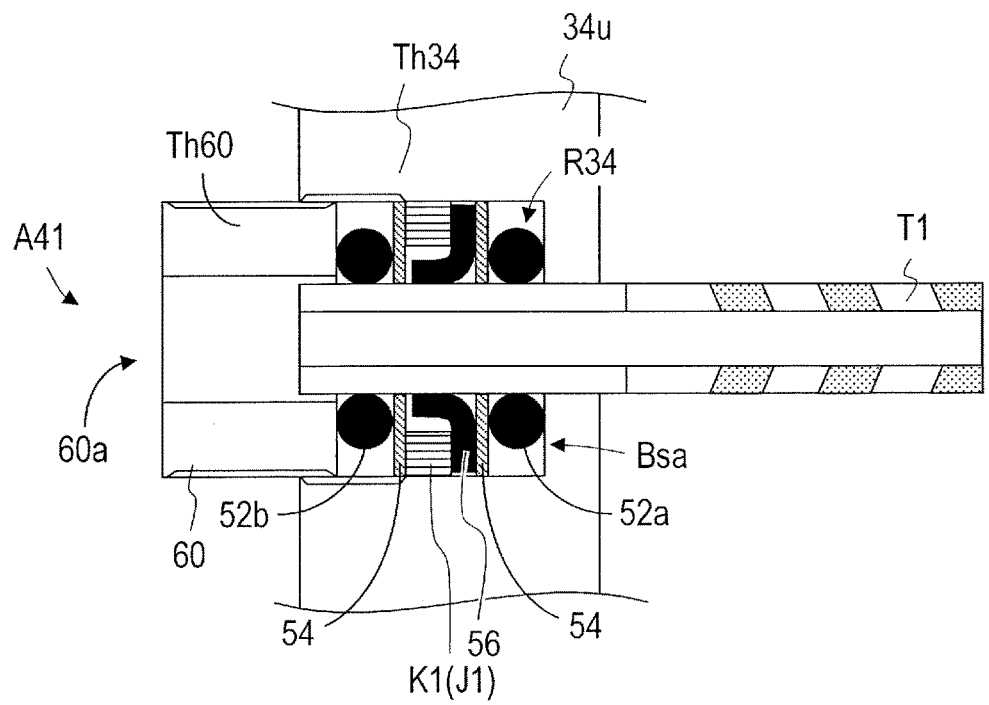
FIG. 23A is a cross-sectional view showing another exemplary structure for separating the hot medium and the cold medium from each other and electrically connecting the thermoelectric generation tube and the electrically conductive member together.
Figure 23B:
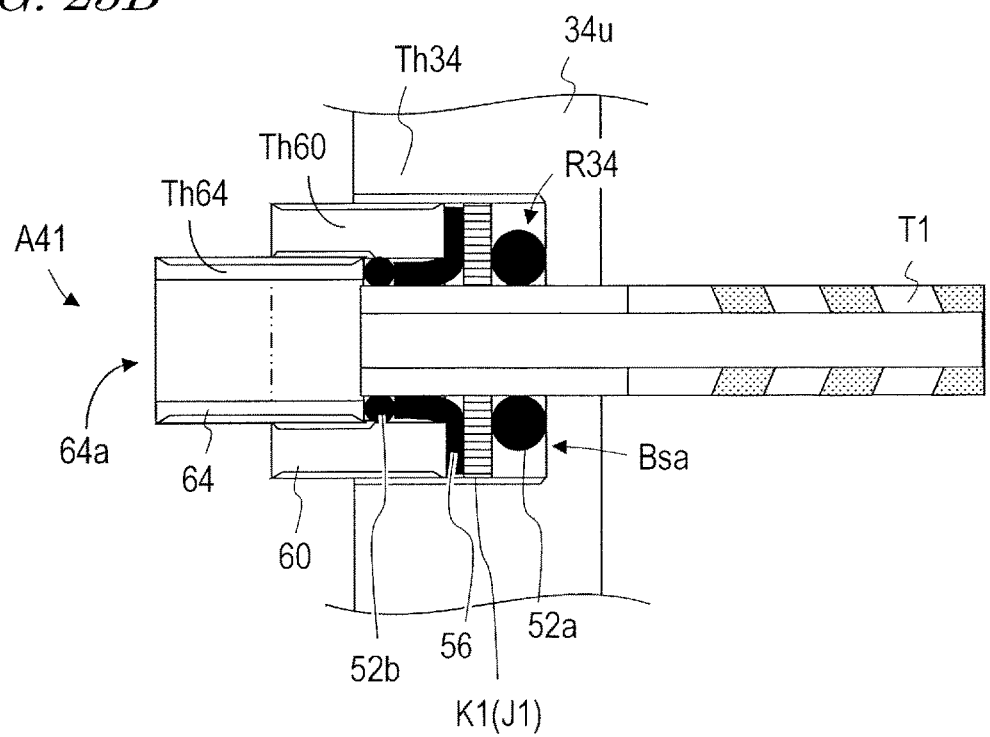
FIG. 23B is a cross-sectional view showing still another exemplary structure for separating the hot medium and the cold medium from each other and electrically connecting the thermoelectric generation tube and the electrically conductive member together.

FIGS. 23A and 23B are cross-sectional views schematically illustrating two other exemplary structures for separating the hot and cold media from each other and electrically connecting the thermoelectric generation tube and the electrically conductive member together. Specifically, in the example shown in FIG. 23A, a first O-ring 52a, a washer 54, the electrically conductive ring member 56, the electrically conductive member K1, another washer 54 and a second O-ring 52b are arranged in this order from the seating surface Bsa of the plate 34u toward the outside of the container 30. In the example illustrated in FIG. 23A, the external thread portion Th60 presses the O-ring 52a against the seating surface Bsa via the electrically conductive member K1 and the flat portion 56f of the electrically conductive ring member 56. On the other hand, in the example shown in FIG. 23B, a first O-ring 52a, the electrically conductive member K1, the electrically conductive ring member 56 and a second O-ring 52b are arranged in this order from the seating surface Bsa of the plate 34u toward the outside of the container 30. In addition, in FIG. 23B, another bushing 64 with a throughhole 64a has been inserted into the throughhole 60a of the bushing 60. The throughhole 64a also communicates with the internal flow path of the thermoelectric generation tube T1. In the example illustrated in FIG. 23B, the external thread portion Th64 of the bushing 64 presses the second O-ring 52b against the seating surface Bsa. Sealing from both of the fluids (the hot and cold media) can be established by arranging the first and second O-rings 52a and 52b in this manner. By establishing sealing from both of the fluids (the hot and cold media), corrosion of the electrically conductive ring member 56 can be reduced.

As described above, one end of the terminal portion Kt of the electrically conductive member K1 sticks out of the plate 34u and can function as a terminal to connect the thermoelectric generation unit to an external circuit. In the implementations shown in FIGS. 22, 23A and 23B, the electrically conductive member K1 (terminal plate) may be replaced with a connection plate such as the electrically conductive member J1. In that case, the end of the thermoelectric generation tube T1 is inserted into the throughhole Jh1. If necessary, a washer 54 may be arranged between the O-ring and the electrically conductive member, for example.

<Embodiment of Thermoelectric Generation System Including Thermoelectric Generation Unit>

Next, an embodiment of a thermoelectric generation system including a thermoelectric generation unit according to the present disclosure will be described.

The aforementioned thermoelectric generation unit 100 may be used alone, or a plurality of thermoelectric generation units 100 may be used in combination. For example, in the case where the thermoelectric generation system includes two thermoelectric generation units 100, this thermoelectric generation system has a plurality of first openings which communicate with the flow paths of the plurality of thermoelectric generation tubes T in one thermoelectric generation unit 100, and a plurality of second openings which communicate with the flow paths of the plurality of thermoelectric generation tubes T in the other thermoelectric generation unit 100. The plurality of thermoelectric generation units 100 may be connected in series or in parallel.

Figure 24A:
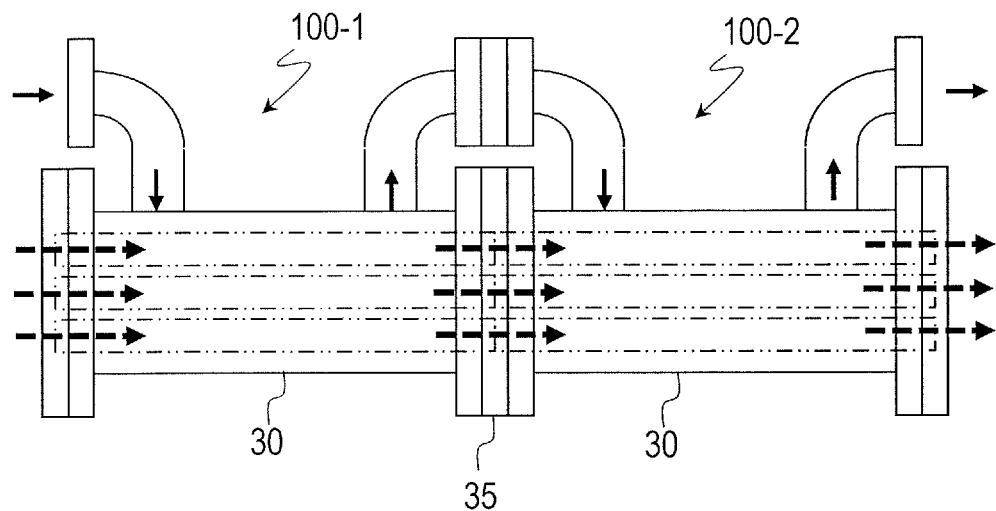
FIG. 24A is a diagram showing an exemplary construction of a thermoelectric generation system including a plurality of thermoelectric generation units.
Figure 24B:
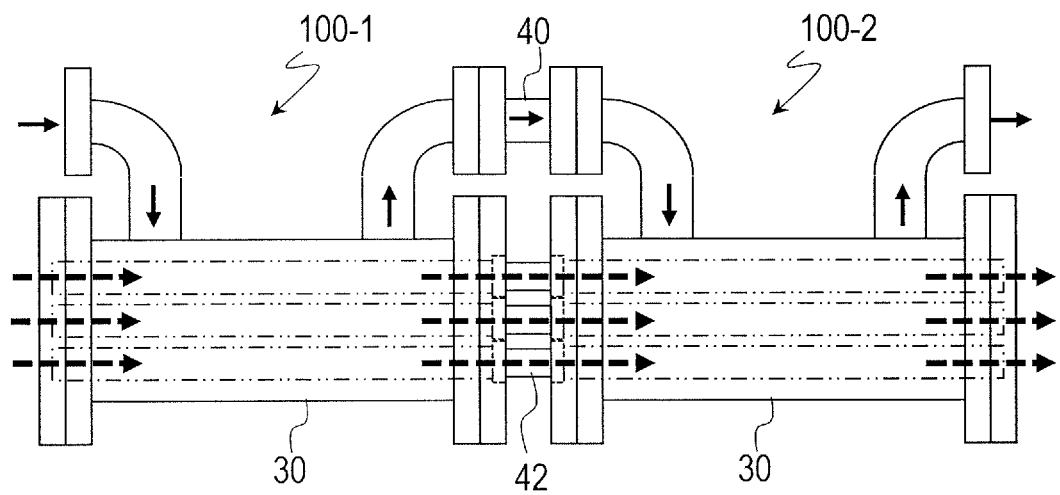
FIG. 24B is a diagram showing another exemplary construction of a thermoelectric generation system including a plurality of thermoelectric generation units.
Figure 24C:
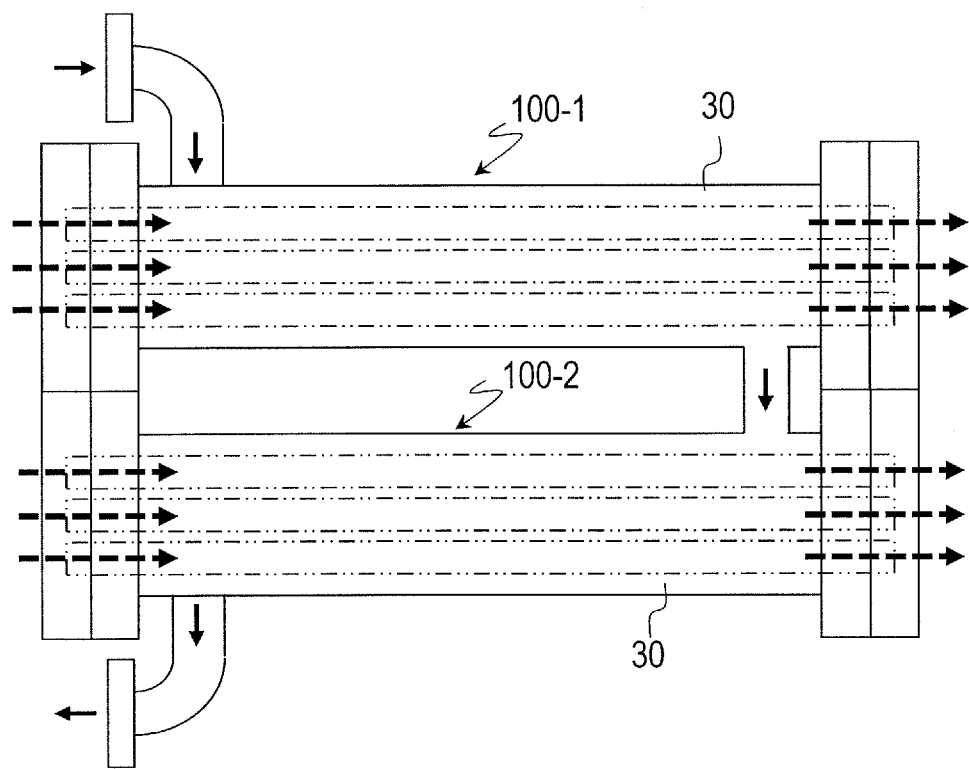
FIG. 24C is a diagram showing still another exemplary construction of a thermoelectric generation system including a plurality of thermoelectric generation units.

Next, with reference to FIG. 24A, FIG. 24B, and FIG. 24C, an exemplary construction for a thermoelectric generation system including a plurality of thermoelectric generation units will be described. In FIG. 24A, FIG. 24B, and FIG. 24C, bold solid arrows generally indicate the flow direction of the medium in contact with the outer peripheral surface of a thermoelectric generation tube (i.e., the medium flowing inside of the container 30 (and outside of the thermoelectric generation tube)). On the other hand, bold dashed arrows generally indicate the flow direction of the medium in contact with the inner peripheral surface of a thermoelectric generation tube (i.e., the medium flowing through the throughhole (i.e., the inner flow path) of the thermoelectric generation tube). In the present specification, a path communicating with the fluid inlet port and outlet port of each container 30 may occasionally be referred to as a "first medium path" and a path encompassing the flow path of each thermoelectric generation tube may occasionally be referred to as a "second medium path" hereinbelow.

First, look at FIG. 24A. The thermoelectric generation system shown in FIG. 24A includes first and second thermoelectric generation units 100-1 and 100-2, each of which has the same construction as the thermoelectric generation unit 100 described above. In the example of FIG. 24A, a space communicating with the fluid inlet port and fluid outlet port of the container 30 of the first thermoelectric generation unit 100-1 and with the fluid inlet port and fluid outlet port of the container 30 of the second thermoelectric generation unit 100-2 forms a first medium path. In the example of FIG. 24A, via an intermediary plate 35, the flow paths of the plurality of thermoelectric generation tubes in the first thermoelectric generation unit 100-1 respectively communicate with the flow paths of the plurality of thermoelectric generation tubes in the second thermoelectric generation unit 100-2. As a result, a second medium path encompassing the flow paths of the plurality of thermoelectric generation tubes T in the first thermoelectric generation unit 100-1 and the second thermoelectric generation unit 100-2 is formed.

Next, FIG. 24B is referred to. Similarly to the example of FIG. 24A, the thermoelectric generation system shown in FIG. 24B also includes a first thermoelectric generation unit 100-1 and a second thermoelectric generation unit 100-2. However, in the example of FIG. 24B, the flow paths of the plurality of thermoelectric generation tubes in the first thermoelectric generation unit 100-1 respectively communicate with the flow paths of the plurality of thermoelectric generation tubes in the second thermoelectric generation unit 100-2 via an intermediary conduit 42. The medium that has been supplied into the container 30 of the first thermoelectric generation unit 100-1 is supplied to the inside of the container 30 of the second thermoelectric generation unit 100-2 through the conduit 40. It should be noted that the conduits 40 and 42 do not need to be straight, but may be bent.

Next, FIG. 24C is referred to. The thermoelectric generation system shown in FIG. 24C includes a first thermoelectric generation unit 100-1 and a second thermoelectric generation unit 100-2 which are disposed in parallel relationship. In the example of FIG. 24C, the medium flowing through the thermoelectric generation tubes in the first thermoelectric generation unit 100-1 and the medium flowing through the thermoelectric generation tubes in the second thermoelectric generation unit 100-2 flow in parallel. Note that the medium which is supplied to the inside of the container 30 of the first thermoelectric generation unit 100-1 flows into the container 30 of the second thermoelectric generation unit 100-2.

Thus, various designs are possible for the flow paths of the hot and cold media in a thermoelectric generation system which includes a plurality of thermoelectric generation units. FIGS. 24A, 24B, and 24C merely provide some examples; the first medium path communicating with the fluid inlet port and fluid outlet port of each container and the second medium path encompassing the flow paths of the respective thermoelectric generation tubes may be arbitrarily designed. In the embodiments illustrated FIGS. 24A, 24B, and 24C, the second medium path is arranged so that the fluid flowing in the flow paths of the plurality of thermoelectric generation tubes T flows in the same direction. However, the flow direction of the fluid through the flow paths of the plurality of thermoelectric generation tubes T does not need to be the same direction. The flow direction of the fluid through the flow paths of the plurality of thermoelectric generation tubes T may be set in various manners according to the design of the flow paths of the hot and cold media.

<Exemplary Construction of Electric Circuit Included in Thermoelectric Generation System>

Next, with reference to FIG. 25, an exemplary construction of an electric circuit included in the thermoelectric generation system according to the present disclosure will be described.

Figure 25:
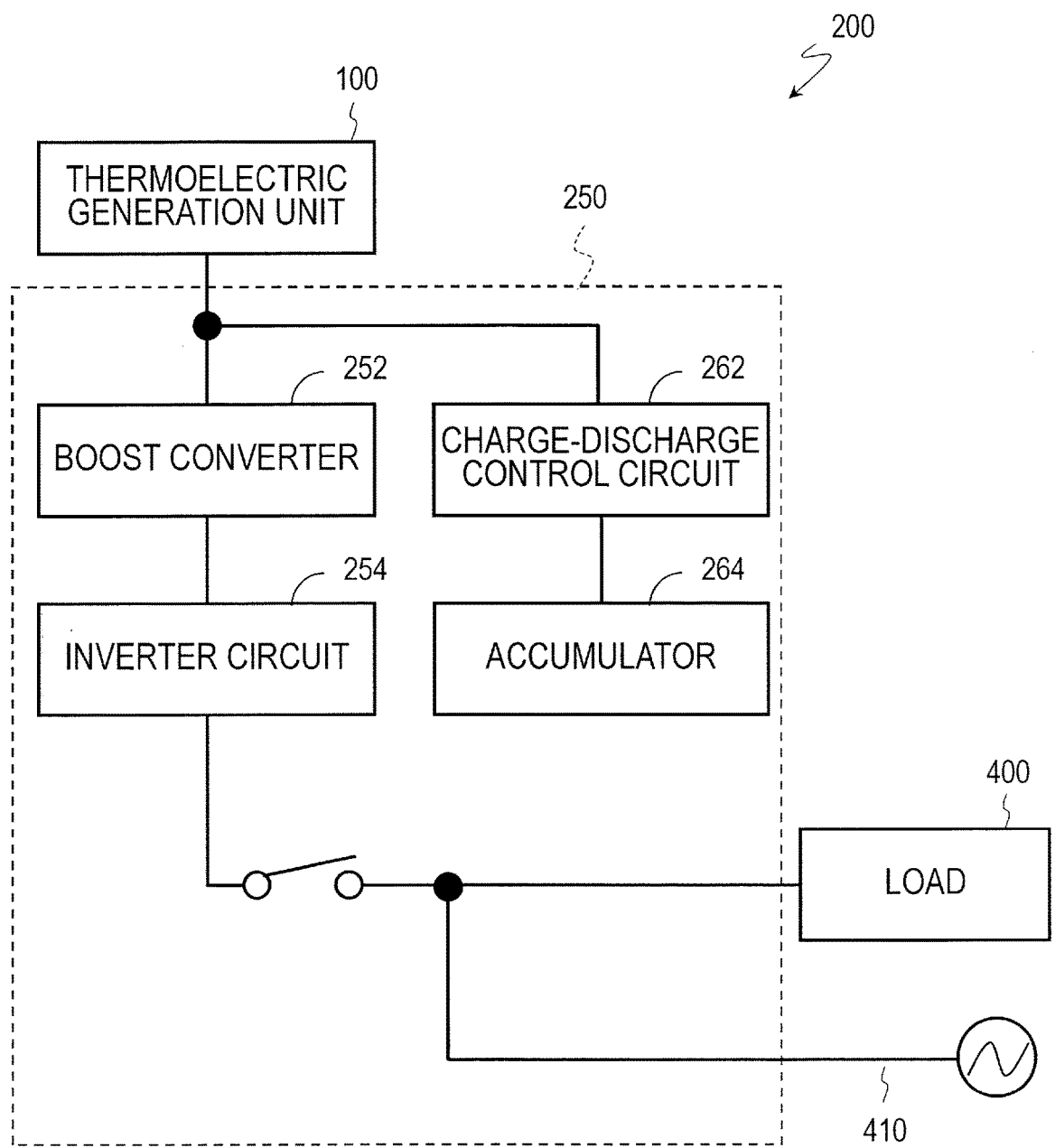
FIG. 25 is a block diagram showing an exemplary construction for an electric circuit in a thermoelectric generation system according to the present disclosure.

In the example of FIG. 25, a thermoelectric generation system 200 according to the present embodiment includes an electric circuit 250 which receives the electric power that is output from the thermoelectric generation unit 100. The electric circuit 250 includes a boost converter 252 which boosts the voltage of the electric power that is output from the thermoelectric generation unit 100, and an inverter (DC-AC inverter) circuit 254 which converts the DC power that is output from the boost converter 252 into AC power (whose frequency may be e.g. 50/60 Hz or any other frequency). The AC power which is output from the inverter circuit 254 may be supplied to a load 400. The load 400 may be any of various electrical devices or electronic devices that operate by using AC power. The load 400 may in itself have a charging function, and does not need to be fixed on the electric circuit 250. Any AC power that has not been consumed by the load 400 may be connected to a commercial grid 410, thus to sell electricity.

The electric circuit 250 in the example of FIG. 25 includes a charge-discharge control circuit 262 and an accumulator 264 for storing the DC power that is obtained from the thermoelectric generation unit 100. The accumulator 264 may be a chemical battery such as a lithium ion secondary battery, or a capacitor such as an electric double-layer capacitor, for example. As necessary, the electric power which is stored in the accumulator 264 may be fed to the boost converter 252 by the charge-discharge control circuit 262, and, via the inverter circuit 254, used or sold as AC power.

The level of electric power which is obtained from the thermoelectric generation unit 100 may fluctuate over time, either periodically or irregularly. For example, when the heat source for the hot medium is waste heat from a factory, the temperature of the hot medium may fluctuate depending on the operating schedule of the factory. In such a case, the state of power generation of the thermoelectric generation unit 100 may fluctuate, thus causing the voltage and/or electric current of the electric power obtained from the thermoelectric generation unit 100 to fluctuate in magnitude. Despite such fluctuations in the state of power generation, the thermoelectric generation system 200 shown in FIG. 25 can suppress the influence of fluctuations of power generation output by storing electric power in the accumulator 264 via the charge-discharge control circuit 262.

In the case where electric power is to be consumed in real time along with the power generation, the boost ratio of the boost converter 252 may be adjusted according to the fluctuations in the state of power generation. Moreover, fluctuations in the state of power generation may be detected or predicted, and the flow rate, temperature, or the like of the hot medium or cold medium to be supplied to the thermoelectric generation unit 100 may be adjusted, thus achieving a control to maintain the state of power generation to be in a stationary state.

FIG. 4 is referred to again. In the exemplary system illustrated in FIG. 4, the flow rate of the hot medium can be adjusted with a pump P1. Similarly, the flow rate of the cold medium can be adjusted with a pump P2. By adjusting the flow rate of both or one of the hot medium and the cold medium, it is possible to control the power generation output from the thermoelectric generation tube.

It is also possible to control the temperature of the hot medium by adjusting the amount of heat to be supplied to the hot medium from a high-temperature heat source not shown. Similarly, it is also possible to control the temperature of the cold medium by adjusting the amount of heat to be released from the cold medium to a low-temperature heat source not shown.

Although not shown in FIG. 4, a valve and branches may be provided for at least one of the flow path of the hot medium and the flow path of the cold medium, thus adjusting the flow rate of the respective medium supplied to the thermoelectric generation system.

<Another Embodiment of Thermoelectric Generation System>

Another embodiment of a thermoelectric generation system according to the present disclosure will now be described with reference to FIG. 26.

In the present embodiment, a thermoelectric generation unit (such as the thermoelectric generation unit 100) according to the present disclosure is provided for a general waste disposal facility (that is, a so-called "garbage disposal facility" or a "clean center"). In recent years, at a waste disposal facility, high-temperature, high-pressure steam (at a temperature of 400 to 500 degrees Celsius and at a pressure of several MPa) is sometimes generated from the thermal energy produced when garbage (waste) is incinerated. Such steam energy is converted into electricity by turbine generator and the electricity thus generated is used to operate the equipment in the facility.

The thermoelectric generation system 300 of the present embodiment includes at least one thermoelectric generation unit 100 as described above. In the example illustrated in FIG. 26, the hot medium supplied to the thermoelectric generation unit 100 has been produced based on the heat of combustion generated at the waste disposal facility. More specifically, this system includes an incinerator 310, a boiler 320 to produce high-temperature, high-pressure steam based on the heat of combustion generated by the incinerator 310, and a turbine 330 which is driven by the high-temperature, high-pressure steam produced by the boiler 320. The energy generated by the turbine 330 driven is given to a synchronous generator (not shown), which converts the energy into AC power (such as three-phase AC power).

The steam that has been used to drive the turbine 330 is turned back into liquid water by a condenser 360, and then is supplied by a pump 370 to the boiler 320. This water is a working medium that circulates through a "heat cycle" formed by the boiler 320, turbine 330 and condenser 360. Part of the heat given by the boiler 320 to the water does work to drive the turbine 330 and then is given by the condenser 360 to cooling water. In general, cooling water circulates between the condenser 360 and a cooling tower 350 as indicated by the dotted arrows in FIG. 26.

Thus, only a part of the heat generated by the incinerator 310 is converted by the turbine 330 into electricity, and the thermal energy that the low-temperature, low-pressure steam possesses after the turbine 330 is rotated is often not converted into, and used as, electrical energy, but instead dumped into the ambient conventionally. According to the present embodiment, however, the low-temperature steam or hot water that has done work at the turbine 330 can be used effectively as a heat source for the hot medium. In the present embodiment, heat is obtained by the heat exchanger 340 from the steam at such a low temperature (e.g. 140 degrees Celsius) and hot water of e.g. 99 degrees Celsius is obtained. This hot water is supplied as the hot medium to the thermoelectric generation unit 100.

As the cold medium, on the other hand, a part of the cooling water used at a waste disposal facility may be utilized, for example. When the waste disposal facility has the cooling tower 350, water at about 10 degrees Celsius can be obtained from the cooling tower 350 and used as the cold medium. Alternatively, the cold medium does not need to be obtained from a special cooling tower, but may also be well water or river water inside the facility or in the neighborhood.

Figure 26:
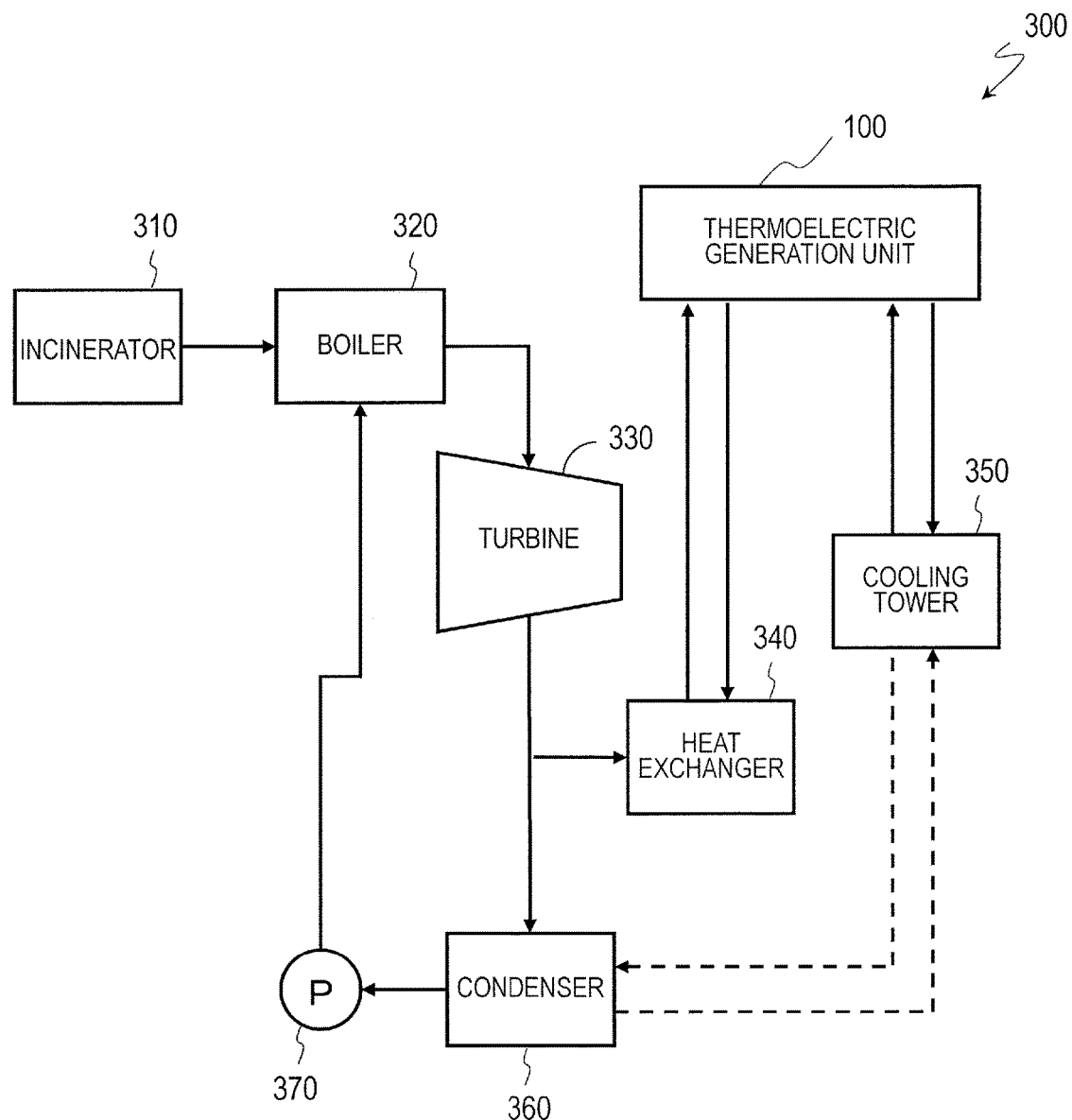
FIG. 26 is a block diagram showing an exemplary construction for an embodiment in which a thermoelectric generation system according to the present disclosure is used.

The thermoelectric generation unit 100 shown in FIG. 26 may be connected to the electric circuit 250 shown in FIG. 25, for example. The electricity generated by the thermoelectric generation unit 100 may be either used in the facility, or accumulated in the accumulator 264. Any extra electric power may be converted into AC power and then sold through the commercial grid 410.

The thermoelectric generation system 300 shown in FIG. 26 has a construction in which the thermoelectric generation unit according to the present disclosure is incorporated into the waste heat utilization system of a waste disposal facility that includes the boiler 320 and the turbine 330. However, the boiler 320, turbine 330, condenser 360 and heat exchanger 340 are not indispensable elements to operate the thermoelectric generation unit 100 according to the present disclosure. If there is any gas or hot water of relatively low temperature which would conventionally have been disposed of, such gas or water can be effectively used as the hot medium in a direct manner, or utilized to heat another gas or liquid with a heat exchanger, which can then be used as a hot medium. The system shown in FIG. 26 is just one of many practical examples.

As is clear from the foregoing description of the embodiments, according to an embodiment of the thermoelectric generation unit of the present disclosure, electrical connection among a plurality of thermoelectric generation tubes can be stably achieved by using electrically conductive members accommodated in channels which are provided in the plates. Since such thermoelectric generation tubes are used in an environment which involves contact with a hot medium and a cold medium, there is a possibility of short circuiting or corrosion if any portion of electrical connection comes in contact with such media. In accordance with an embodiment of the present disclosure, electrically conductive members can be placed within a space in which sealing of the hot and cold media can be relatively easily realized, it is easy to reconcile both electrical interconnection among a plurality of thermoelectric generation tubes and sealing.

As will be clear from the above description, a production method for a thermoelectric generation unit according to the present disclosure includes a step of providing a plurality of aforementioned thermoelectric generation tubes, a step of inserting the plurality of thermoelectric generation tubes into a plurality of openings of a container having the aforementioned construction so that the plurality of thermoelectric generation tubes are retained inside the container, and a step of allowing a plurality of electrically conductive members to be housed in the channels of the container to provide electrical interconnection between the plurality of thermoelectric generation tubes, with the plurality of electrically conductive members.

Moreover, an electric generation method according to the present disclosure includes a step of allowing a first medium to flow in the container of the aforementioned thermoelectric generation unit via the fluid inlet port and fluid outlet port of the container, so that the first medium is in contact with the outer peripheral surface of each thermoelectric generation tube; a step of allowing a second medium having a different temperature from a temperature of the first medium to flow in the flow path in each thermoelectric generation tube; and a step of retrieving power generated in the plurality of thermoelectric generation tubes via the plurality of electrically conductive members.

The thermoelectric generation unit according to the present disclosure can be used as an electric generator that utilizes the heat of effluent gas, etc., which is discharged from an automobile, a factory, or the like; or as a small-sized portable electric generator.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A thermoelectric generation unit comprising a plurality of thermoelectric generation tubes,
   each of the plurality of thermoelectric generation tubes including a structure in which first layers made of a first material having a relatively low Seebeck coefficient and a relatively high thermal conductivity and second layers made of a second material having a relatively high Seebeck coefficient and a relatively low thermal conductivity are alternately stacked while being inclined with respect to an axial direction of each thermoelectric generation tube, each thermoelectric generation tube having an outer peripheral surface, an inner peripheral surface, and a flow path defined by the inner peripheral surface, and generating an electromotive force in an axial direction of the thermoelectric generation tube based on a temperature difference between the inner peripheral surface and the outer peripheral surface;
   the thermoelectric generation unit further including
   a container housing the plurality of thermoelectric generation tubes inside, the container having a fluid inlet port and a fluid outlet port for allowing a fluid to flow inside the container and a plurality of openings into which the respective thermoelectric generation tubes are inserted, and
   a plurality of electrically conductive members providing electrical interconnection for the plurality of thermoelectric generation tubes,
   the container including:
   a shell surrounding the plurality of thermoelectric generation tubes; and
   a pair of plates each being fixed to the shell and having the plurality of openings, with channels being formed so as to house the plurality of electrically conductive members and interconnect at least two of the plurality of openings, wherein,
   respective ends of the thermoelectric generation tubes are inserted in the plurality of openings of the plates, the plurality of electrically conductive members being housed in the channels in the plates;
   the plurality of thermoelectric generation tubes include first and second thermoelectric generation tubes connected electrically in series via one of the plurality of electrically conductive members, such that planes of stacking in the first thermoelectric generation tube and planes of stacking in the second thermoelectric generation tube are inclined in opposite directions to each other; and
   the plurality of thermoelectric generation tubes are connected electrically in series by the plurality of electrically conductive members housed in the channels.

2. The thermoelectric generation unit of claim 1, wherein, the plurality of electrically conductive members include
   at least one connection plate having two throughholes in which two said thermoelectric generation tubes are respectively inserted, and
   two terminal plates each having one throughhole in which one said thermoelectric generation tube is inserted and having an end protruding to the exterior; and
   each of the plurality of electrically conductive members is electrically connected to the thermoelectric generation tube or tubes inserted in the throughhole or throughholes.

3. The thermoelectric generation unit of claim 2, wherein, the channels include
   at least one interconnection connecting two or more of the plurality of openings together, and two terminal connections respectively extending from two of the plurality of openings to an outer edge of the plate or plates;

the at least one connection plate is housed in the at least one interconnection; and the two terminal plates are respectively housed in the two terminal connections, each terminal plate partially protruding to the exterior of the plate.

4. The thermoelectric generation unit of claim 2, wherein, between the two terminal plates, the plurality of thermoelectric generation tubes are connected electrically in series via the at least one connection plate; and power generated in the plurality of thermoelectric generation tubes is retrieved to the exterior at the two terminal plates.

5. The thermoelectric generation unit of claim 1, wherein the plurality of electrically conductive members each include a body made of a metal and an insulating coating at least partially covering a surface of the body.

6. The thermoelectric generation unit of claim 1, wherein each of the plurality of thermoelectric generation tubes has a chamfered portion at an end.

7. The thermoelectric generation unit of claim 1, wherein each of the plurality of thermoelectric generation tubes includes a molded portion or a mark at at least one end, the molded portion or mark indicating the polarity of a voltage which is generated by introducing a temperature difference between the inner peripheral surface and the outer peripheral surface.

8. A thermoelectric generation system comprising:
the thermoelectric generation unit of claim 1;
a first medium path communicating with the fluid inlet port and the fluid outlet port of the container;
a second medium path encompassing the flow paths of the plurality of thermoelectric generation tubes; and
an electric circuit electrically connected to the plurality of electrically conductive members to retrieve power generated in the plurality of thermoelectric generation tubes.

9. The thermoelectric generation system of claim 8, further comprising an accumulator connected to the electric circuit.

10. The thermoelectric generation system of claim 8, further comprising an inverter connected to the electric circuit.

11. A thermoelectric generation system comprising a plurality of thermoelectric generation units including a first thermoelectric generation unit and a second thermoelectric generation unit,
the first and second thermoelectric generation units each being the thermoelectric generation unit of claim 1, wherein
the thermoelectric generation system has a plurality of first openings communicating with the flow paths of the plurality of thermoelectric generation tubes in the first thermoelectric generation unit, and a plurality of second openings communicating with the flow paths of the plurality of thermoelectric generation tubes in the second thermoelectric generation unit.

12. The thermoelectric generation system of claim 11, comprising:
a first medium path communicating with the fluid inlet port and fluid outlet port of the container in the first thermoelectric generation unit and the fluid inlet port and fluid outlet port of the container in the second thermoelectric generation unit; and
a second medium path encompassing the flow paths of the plurality of thermoelectric generation tubes in the first and second thermoelectric generation units.

13. The thermoelectric generation system of claim 12, wherein the second medium path is arranged to allow a fluid to flow in a same direction in the flow paths of the plurality of thermoelectric generation tubes.

14. A production method for a thermoelectric generation unit, comprising:
a step of providing a plurality of thermoelectric generation tubes, each of the plurality of thermoelectric generation tubes including a structure in which first layers made of a first material having a relatively low Seebeck coefficient and a relatively high thermal conductivity and second layers made of a second material having a relatively high Seebeck coefficient and a relatively low thermal conductivity are alternately stacked while being inclined with respect to an axial direction of each thermoelectric generation tube, each thermoelectric generation tube having an outer peripheral surface, an inner peripheral surface, and a flow path defined by the inner peripheral surface, and generating an electromotive force in an axial direction of the thermoelectric generation tube based on a temperature difference between the inner peripheral surface and the outer peripheral surface;

a step of inserting the plurality of thermoelectric generation tubes into a plurality of openings of a container having a fluid inlet port and a fluid outlet port for allowing a fluid to flow inside the container and channels, at least one of the channels interconnecting at least two of the plurality of openings, so that the plurality of thermoelectric generation tubes are retained inside the container, wherein planes of stacking in at least two of the plurality of thermoelectric generation tubes are inclined in opposite directions to each other; and a step of allowing a plurality of electrically conductive members to be housed in the channels of the container so that the plurality of thermoelectric generation tubes are connected electrically in series by the plurality of electrically conductive members, wherein ends of the at least two thermoelectric generation tubes having planes of stacking inclined in opposite directions to each other are connected electrically in series via one of the plurality of electrically conductive members.

15. An electric generation method using the thermoelectric generation unit of claim 1, comprising:
a step of allowing a first medium to flow in the container via the fluid inlet port and fluid outlet port of the container so that the first medium is in contact with the outer peripheral surface of each thermoelectric generation tube;
a step of allowing a second medium having a different temperature from a temperature of the first medium to flow in the flow path of each thermoelectric generation tube; and
a step of retrieving power generated in the plurality of thermoelectric generation tubes via the plurality of electrically conductive members.

* * * * *